United States Patent
Yonezawa

(10) Patent No.: US 10,291,234 B2
(45) Date of Patent: May 14, 2019

(54) CIRCUIT DEVICE, OSCILLATOR, ELECTRONIC APPARATUS, AND MOVING OBJECT

(71) Applicant: SEIKO EPSON CORPORATION, Tokyo (JP)

(72) Inventor: Takemi Yonezawa, Minowa-machi (JP)

(73) Assignee: SEIKO EPSON CORPORATION, Tokyo (JP)

(*) Notice: Subject to any disclaimer, the term of this patent is extended or adjusted under 35 U.S.C. 154(b) by 230 days.

(21) Appl. No.: 15/386,494

(22) Filed: Dec. 21, 2016

(65) Prior Publication Data

US 2017/0194965 A1    Jul. 6, 2017

(30) Foreign Application Priority Data

Jan. 6, 2016 (JP) .................. 2016-001318

(51) Int. Cl.
| H03L 1/00 | (2006.01) |
| H03L 1/02 | (2006.01) |
| H03L 1/04 | (2006.01) |
| H03L 7/093 | (2006.01) |
| H03L 7/099 | (2006.01) |

(52) U.S. Cl.
CPC .............. *H03L 1/00* (2013.01); *H03L 1/022* (2013.01); *H03L 1/028* (2013.01); *H03L 1/04* (2013.01); *H03L 7/093* (2013.01); *H03L 7/099* (2013.01); *H03L 1/023* (2013.01); *H03L 7/0991* (2013.01)

(58) Field of Classification Search
CPC .......................................... H03L 1/00
USPC ............................................ 331/66
See application file for complete search history.

(56) References Cited

U.S. PATENT DOCUMENTS

| 6,621,361 B1* | 9/2003 | Fry ................ H03L 1/04 331/158 |
| 6,711,230 B1* | 3/2004 | Nicholls ........ G04G 3/00 327/147 |
| 2003/0197567 A1* | 10/2003 | Villella ........ H03L 1/026 331/158 |
| 2006/0192625 A1* | 8/2006 | Sorrells ......... G04F 5/06 331/158 |

FOREIGN PATENT DOCUMENTS

JP        2015-082815 A    4/2015

* cited by examiner

*Primary Examiner* — Joseph Chang
(74) *Attorney, Agent, or Firm* — Oliff PLC

(57) ABSTRACT

A circuit device includes a processor adapted to perform a signal processing of temperature compensation of an oscillation frequency based on temperature detection data from an external temperature sensor disposed outside the circuit device to output frequency control data, and an oscillation signal generation circuit adapted to generate an oscillation signal with the oscillation frequency corresponding to the frequency control data using the frequency control data and a resonator disposed in a thermostatic oven.

10 Claims, 18 Drawing Sheets

| SENSING TEMPERATURE WIDTH $\Delta T_{TS}$ [°C] ($T_{TS}$ [°C]) | NECESSARY PGA GAIN (EXTERNAL TEMPERATURE SENSOR) | NECESSARY PGA GAIN (INTERNAL TEMPERATURE SENSOR) |
|---|---|---|
| 150 (−50~100) | 1 | 5.9 |
| 70 (30~100) | 2.3 | 12.6 |
| 30 (70~100) | 5.4 | 29.3 |
| 10 (85~95) | 16 | 87.9 |

$$x(k+1) = A \cdot x(k) + v(k)$$
$$y(k) = x(k) + w(k)$$

| PLLLOCK | KFEN | $\hat{x}(k)$ |
|---------|------|--------------|
| 0 | 0 | DFCI (THROUGH OUTPUT) |
| 0 | 1 | HOLD PREVIOUS OUTPUT STATE |
| 1 | 0 | DFCI (THROUGH OUTPUT) |
| 1 | 1 | TRUE VALUE ESTIMATION PROCESS (KALMAN FILTERING) |

CIRCUIT DEVICE, OSCILLATOR, ELECTRONIC APPARATUS, AND MOVING OBJECT

CROSS-REFERENCE TO RELATED APPLICATIONS

The present application claims priority to Japanese Patent Application JP 2016-001318, filed Jan. 6, 2016, the entire disclosure of which is hereby incorporated by reference herein.

BACKGROUND

1. Technical Field

Various embodiments of the present invention relate to a circuit device, an oscillator, an electronic apparatus, a moving object, and so on.

2. Related Art

In the past, there has been known an oscillator such as an oven controlled crystal oscillator (OCXO), and a temperature compensated crystal oscillator (TCXO). For example, the OCXO is used as a reference signal source in a base station, a network router, a measurement device, or the like.

As the related art of such an oscillator, there exists, for example, a technology disclosed in JP-A-2015-82815. In the related art, an aging correction of the oscillation frequency is performed in order to increase the accuracy of the oscillation frequency. Specifically, there are disposed a storage adapted to store correspondence relationship information between a correction value of a control voltage of the oscillation frequency and elapsed time, and an elapsed time measurer. Further, an aging correction is performed based on the correspondence relationship information between the correction value and the elapsed time stored in the storage, and the elapsed time measured by the elapsed time measurer.

As described above, in the oscillator such as the OCXO or the TCXO, there is a demand for an increase in accuracy of the oscillation frequency of the oscillation signal.

In such an oscillator, in order to obtain the oscillation frequency higher in accuracy, the OCXO having a resonator the temperature of which is controlled by a thermostatic oven is preferable. In the OCXO, although the temperature of the resonator is controlled, in reality, if the ambient temperature of the thermostatic oven varies, the temperature of the resonator varies due to the influence of the variation of the ambient temperature of the thermostatic oven, and the oscillation frequency slightly varies. Therefore, in order to obtain the oscillation frequency higher in accuracy, the temperature compensation is necessary. The temperature compensation is for reducing the variation in oscillation frequency due to the temperature variation of the resonator. Specifically, in the temperature compensation, the temperature of the resonator is measured by a temperature sensor, and the control is performed so that the oscillation frequency becomes constant based on the temperature thus measured. Although the temperature sensor is provided to, for example, a circuit device for generating an oscillation signal, the circuit device (the temperature sensor) is disposed in the thermostatic oven so as to be able to measure the temperature of the resonator.

However, as described above, the temperature is basically controlled in the thermostatic oven as described above. Therefore, although affected by the ambient temperature, if the temperature sensor incorporated in the circuit device is used alone, the variation range of the sensing temperature due to the variation in the ambient temperature becomes small, and the temperature compensation with high accuracy cannot be achieved. For example, the sensing voltage of the temperature sensor is A/D converted by an A/D conversion circuit, and the temperature detection data is used for the temperature compensation. In this case, since the variation range of the sensing voltage becomes extremely small with respect to the input full scale of the A/D conversion circuit, the resolution of the A/D conversion circuit becomes low (the code variation range with respect to the variation range of the sensing voltage becomes small), and there is a possibility that the temperature compensation with high accuracy cannot be achieved.

SUMMARY

An advantage of some aspects of the invention is to provide a circuit device, an oscillator, an electronic apparatus, a moving object, and so on capable of obtaining a highly stable oscillation frequency with small temperature dependency of the oscillation frequency.

An aspect of the invention relates to a circuit device including an A/D converter adapted to perform A/D conversion on a temperature detection voltage to output temperature detection data, a processor adapted to perform a signal processing of temperature compensation of an oscillation frequency based on the temperature detection data, an oscillation signal generation circuit adapted to generate an oscillation signal with the oscillation frequency corresponding to the frequency control data using the frequency control data and an oven-type resonator disposed in a thermostatic oven, and a temperature sensor input terminal adapted to input the temperature detection voltage from an external temperature sensor disposed outside the circuit device.

According to the aspect of the invention, it is possible to dispose the external temperature sensor outside the circuit device, input the temperature detection voltage from the external temperature sensor to the circuit device via the temperature sensor input terminal, perform the A/D conversion on the temperature detection voltage thus input to output the temperature detection data, and perform the signal processing of the temperature compensation of the oscillation frequency based on the temperature detection data. Thus, it is possible to increase the variation range of the sensing temperature to improve the temperature resolution of the temperature detection data compared to the case of incorporating the temperature sensor in the circuit device. Further, by performing the temperature compensation process using the temperature detection data high in temperature resolution, it is possible to obtain the highly stable oscillation frequency low in temperature dependency.

In the aspect of the invention, the temperature detection voltage may be input from the temperature sensor input terminal to the A/D converter via the programmable gain amplifier.

There is a possibility that a variety of temperature sensors different in characteristics (e.g., sensitivity and an output voltage range) are connected as the external temperature sensor. As described above, by providing the temperature sensor input terminal, there is a possibility that the temperature sensors having a variety of characteristics are connected. In this regard, according to this aspect of the invention, by disposing the programmable gain amplifier in the anterior stage of the A/D converter, it is possible to adjust the gain in accordance with the temperature sensors having the variety of characteristics.

In the aspect of the invention, the temperature detection data from the A/D converter may be input to the processor via the digital filter.

The noise is included in the temperature detection voltage from the external temperature sensor and the internal temperature sensor. Further, since there is provided the programmable gain amplifier, the noise in the temperature detection voltage is amplified by the gain thereof. If the temperature compensation process is performed using the temperature detection voltage including the noise, it results that the noise is included in the frequency control data, and thus, the characteristic (e.g., the phase noise) of the oscillation signal is deteriorated. In this regard, according to the aspect of the invention with the configuration described above, since the filtering of the temperature detection data can be performed by the digital filter, the noise in the temperature detection data (the noise in the temperature detection voltage) can be reduced.

In the aspect of the invention, the circuit device may include an internal temperature sensor, and the A/D converter may perform A/D conversion on an internal temperature detection voltage from the internal temperature sensor as the temperature detection voltage in a first mode, and perform A/D conversion on the external temperature detection voltage input from the external temperature sensor via the temperature sensor input terminal as the temperature detection voltage in a second mode.

According to this configuration, it is possible to select an appropriate temperature sensor depending on, for example, the intended use of the oscillator. For example, in the case in which it is intended to reduce the cost without disposing the external temperature sensor, the internal temperature sensor can be selected. In contrast, in the case in which it is intended to obtain the highly accurate oscillation frequency, the external temperature sensor can be selected. Further, according to the aspect of the invention with the configuration described above, since the programmable gain amplifier is provided, it is possible to deal with such a variety of temperature sensors.

In the aspect of the invention, the processor may extract an aging variation component from variation components of the frequency control data including the aging variation component and a temperature variation component based on the temperature detection data obtained from the temperature detection voltage, and then perform an aging correction process of the frequency control data based on the aging variation component extracted.

According to the aspect of the invention with this configuration, since the temperature sensor input terminal is provided, it is possible to use the external temperature sensor, and thus, it is possible to suppress the frequency correction error in the temperature compensation. Therefore, when extracting the aging variation component from the variation components of the frequency control data including the aging variation component and the temperature variation component, the aging variation component can accurately be extracted while accurately removing the temperature variation component.

In the aspect of the invention, the oven-type resonator may be a double oven-type resonator.

By using the double oven-type resonator, it is possible to make the temperature variation of the resonator small to suppress the variation of the oscillation frequency. However, since the temperature variation is small in the double oven, if the temperature sensor incorporated in the circuit device is used, the frequency correction error in the temperature compensation becomes larger. In this regard, according to the aspect of the invention with the configuration described above, since the temperature sensor input terminal is provided, it becomes possible to dispose the external temperature sensor outside the double oven, and thus, the frequency correction error in the temperature compensation can be reduced.

In the aspect of the invention, the circuit device may include an oven control circuit adapted to control the heater disposed so as to correspond to the oven-type resonator.

By controlling heating of the heater with the oven control circuit, it is possible to realize the oven-type resonator with the temperature of the resonator controlled. In such an oven with the temperature controlled, the temperature variation is small. According to the aspect of the invention with the configuration described above, since it becomes possible to dispose the external temperature sensor outside the thermostatic oven, the highly accurate temperature compensation is achievable.

Another aspect of the invention relates to an oscillator including the circuit device according to any one of those described above, the external temperature sensor, the oven-type resonator, and a heater disposed so as to correspond to the oven-type resonator.

In another aspect of the invention, defining the distance between the oven-type resonator and the circuit device as L1, and the distance between the oven-type resonator and the external temperature sensor as L2, L2>L1 may be true.

The closer to the oven-type resonator, the more appropriately the temperature is controlled, and the further from the oven-type resonator, the more easily the temperature is varied due to the variation of the environmental temperature. In this regard, according to the aspect of the invention with the configuration described above, the external temperature sensor is further from the oven-type resonator than the circuit device. Further, the temperature sensor input terminal for inputting the temperature detection voltage from such an external temperature sensor is provided to the circuit device. Thus, it becomes possible to detect the temperature variation broader in variation range using the external temperature sensor, and by using the temperature detection voltage, the accurate temperature compensation process becomes possible.

Still another aspect of the invention relates to an electronic apparatus including any one of the circuit devices described above.

Yet another aspect of the invention relates to a moving object including any one of the circuit devices described above.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, one or more embodiments of the invention will be described in detail. It should be noted that the one or more embodiments described hereinafter does not unreasonably limit the various embodiments of the invention as set forth in the appended claims, and all of the constituents described in the one or more embodiments are not necessarily essential as means of all of the embodiments for solving the problems.

1. Configuration

Figure 1:
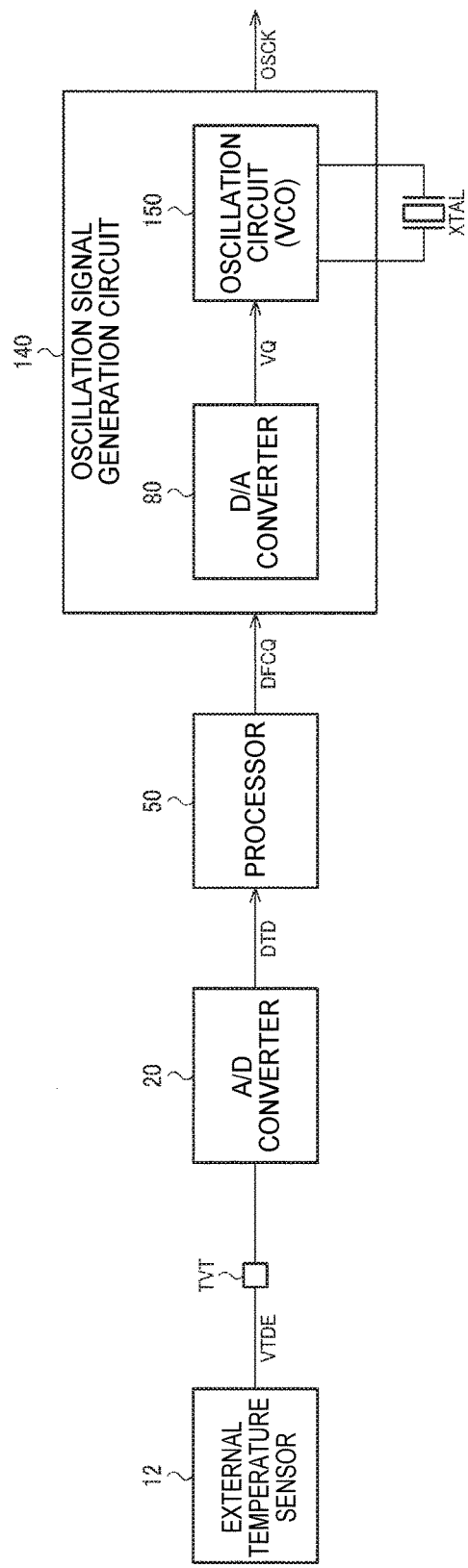
FIG. 1 is a diagram showing a configuration example of a circuit device according to an embodiment the invention.

FIG. 1 shows a configuration example of a circuit device according to the present embodiment. The circuit device includes a temperature sensor input terminal TVT, an A/D converter 20 (an A/D conversion circuit), a processor 50 (a digital signal processor, a processing circuit), and an oscillation signal generation circuit 140.

An external temperature sensor 12 (a first temperature sensor) outputs a temperature-dependent voltage varying in accordance with the environmental temperature as a temperature detection voltage VTDE. The external temperature sensor 12 is disposed outside the circuit device. The circuit device is, for example, a semiconductor chip, and the external temperature sensor 12 is disposed outside the semiconductor chip, or a package housing the semiconductor chip. Specifically, in the case in which the environmental temperature (e.g., the temperature of the outside of the package of the oscillator housing the circuit device and an oscillator XTAL, or the temperature of the outside of a thermostatic oven) varies, the external temperature sensor 12 is disposed at a position where the temperature change is larger than the temperature change at the position of the circuit device. For example, as described later with reference to FIG. 9 through FIG. 10B, the circuit device 500 is disposed inside the thermostatic oven (e.g., a second container 414). Further, the external temperature sensor 12 is disposed outside the package 410 of the oscillator, or inside the package 410 of the oscillator and outside the thermostatic oven (e.g., the second container 414). For example, as the external temperature sensor 12, there can be used a thermistor, a diode (a PN junction in a broad sense), and so on.

To the A/D converter 20, there is input the temperature detection voltage VTDE from the external temperature sensor 12 via the temperature sensor input terminal TVT. The A/D converter 20 performs the A/D conversion of the temperature detection voltage VTDE to output the temperature detection data DTD. For example, the digital temperature detection data DTD (A/D result data) corresponding to the A/D conversion result of the temperature detection voltage VTDE is output. As the A/D conversion method of the A/D converter 20, there can be adopted, for example, a successive approximation method, a method similar to the successive approximation method, and so on. It should be noted that the A/D conversion method is not limited to such methods, but a variety of methods (e.g., a counting type, a parallel comparison type, or a serial-parallel type) can be adopted.

The processor 50 performs a variety of types of signal processing (digital signal processing). For example, the processor 50 performs a temperature compensation process of the oscillation frequency (the frequency of the oscillation signal) based on the temperature detection data DTD. Specifically, the processor 50 performs the temperature compensation process for decreasing the variation of the oscillation frequency in the case in which the temperature change occurs, based on the temperature detection data DTD varying in accordance with the temperature, coefficient data (data of the coefficients of an approximation function) for the temperature compensation processing, and so on. Further, it is also possible for the processor 50 to perform the signal processing such as aging correction process or a Kalman filtering as needed. Then, the processor 50 outputs frequency control data DFCQ (a frequency control code) on which the signal processing has been performed. The processor 50 can be realized by an ASIC circuit such as a gate array, and can also be realized by a processor (e.g., DSP, CPU) and a program (a program module) running on the processor.

The resonator XTAL is a thickness-shear vibration type quartz crystal resonator such as an AT-cut type or an SC-cut type, or a piezoelectric resonator of a flexural vibration type or the like. The resonator XTAL is an oven-type oscillator (OCXO) disposed in a thermostatic oven. The resonator XTAL can also be a resonator (an electromechanical resonator, or an electrical resonance circuit). It should be noted that as the resonator XTAL, a surface acoustic wave (SAW) resonator as a piezoelectric resonator, an MEMS (micro electromechanical systems) resonator as a resonator made of silicon, and so on can be adopted. As a substrate material of the resonator XTAL, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation device of the resonator XTAL, there can be used a device using a piezoelectric effect, or electrostatic drive using a coulomb force.

The oscillation signal generation circuit 140 generates the oscillation signal OSCK. For example, the oscillation signal generation circuit 140 generates the oscillation signal OSCK with the oscillation frequency, which is set by the frequency control data DFCQ, using the frequency control data DFCQ from the processor 50 and the resonator XTAL. As an example, the oscillation signal generation circuit 140 oscillates the resonator XTAL at the oscillation frequency set by the frequency control data DFCQ to generate the oscillation signal OSCK.

It should be noted that the oscillation signal generation circuit 140 can also be a circuit for generating the oscillation signal OSCK with a direct digital synthesizer system. It is also possible to digitally generate the oscillation signal OSCK with the oscillation frequency set by the frequency control data DFCQ using, for example, the oscillation signal of the resonator XTAL (an oscillation source of a fixed oscillation frequency) as a reference signal.

The oscillation signal generation circuit 140 can include a D/A converter 80 and the oscillation circuit 150. It should be noted that the oscillation signal generation circuit 140 is not limited to such a configuration, but a variety of modified implementations such as elimination of some of the constituents or addition of other constituents can be adopted.

The D/A converter 80 performs D/A conversion of the frequency control data DFCQ (output data of the processor) from the processor 50. As the D/A conversion method of the D/A converter 80, there can be adopted, for example, a resistance string type (a resistance division type). It should be noted that the D/A conversion method is not limited to the above, but there can also be adopted a variety of methods such as a resistance ladder type (e.g., an R-2R ladder type), a capacitance array type, and a pulse-width modulation type. Further, the D/A converter 80 can include a control circuit thereof, a modulation circuit (e.g., a dither modulation, or a PWM modulation), a filter circuit, and so on besides the D/A converter.

The oscillation circuit 150 generates the oscillation signal OSCK using an output voltage VQ of the D/A converter 80 and the resonator XTAL. The oscillation circuit 150 is connected to the resonator XTAL via first and second resonator terminals (resonator pads). For example, the oscillation circuit 150 oscillates the resonator XTAL (e.g., a piezoelectric resonator, or a resonator) to thereby generate the oscillation signal OSCK. Specifically, the oscillation circuit 150 oscillates the resonator XTAL at the oscillation frequency obtained by using the output voltage VQ of the D/A converter 80 as the frequency control voltage (the oscillation control voltage). For example, in the case in which the oscillation circuit 150 is a circuit (VCO) for controlling the oscillation of the resonator XTAL by voltage control, the oscillator circuit 150 can include a variable-capacitance capacitor (e.g., a varicap) having the capacitance value varying in accordance with the frequency control voltage.

It should be noted that the oscillation circuit 150 can be realized by the direct digital synthesizer system as described above, and in this case, the oscillation frequency of the resonator XTAL becomes the reference frequency, which is different from the oscillation frequency of the oscillation signal OSCK.

According to the present embodiment described above, the circuit device includes the A/D converter 20 for performing the A/D conversion on the temperature detection voltage VTDE to output the temperature detection data DTD, the processor 50 for performing the signal processing of the temperature compensation of the oscillation frequency based on the temperature detection data DTD, the oscillation signal generation circuit 140 for generating the oscillation signal OSCK with the oscillation frequency corresponding to the frequency control data DFCQ, and the temperature sensor input terminal TVT for inputting the temperature detection voltage VTDE from the external temperature sensor 12 disposed outside the circuit device.

By disposing the temperature sensor input terminal TVT in such a manner as described above, it becomes possible to dispose the external temperature sensor 12 outside the circuit device. Specifically, it becomes possible to dispose the external temperature sensor 12 at a position (e.g., outside the thermostatic oven) where the variation in sensing temperature is large with respect to the variation in the environmental temperature (outside air temperature). Thus, since the variation range of the sensing temperature increases, the variation range of the temperature detection voltage VTDE increases, and it is possible to improve the resolution (the temperature variation corresponding to one LSB) of the temperature detection data DTD. The fact that the temperature detection data DTD is high in resolution means the fact that the temperature compensation of the oscillation frequency can be achieved so as to follow a smaller temperature variation, and thus, it is possible to realize the temperature compensation with a smaller frequency correction error.

In the case of using the oscillator as the reference signal source of, for example, a base station, the oscillation frequency is made to be synchronized with the reference signal (e.g., a GPS signal) using the PLL circuit. In the case in which the reference signal disappears or becomes abnormal due to some reason, the PLL circuit becomes in the hold-over state, and the oscillation circuit 150 becomes in a free-running oscillation state. In this hold-over state, the frequency correction error in the temperature compensation becomes one of the factors of the frequency error (deviation) of the free-running oscillation, and the error is accumulated with time as an error of the time information (the number of pulses of the oscillation signal). Highly accurate time synchronization is required in, for example, communication in the TDD system described later, and if the frequency correction error in the temperature compensation is large, there is a possibility that the time synchronization cannot be achieved. In this regard, in the present embodiment, the highly accurate temperature compensation can be realized (the frequency correction error can be reduced) using the external temperature sensor 12.

Figure 2:
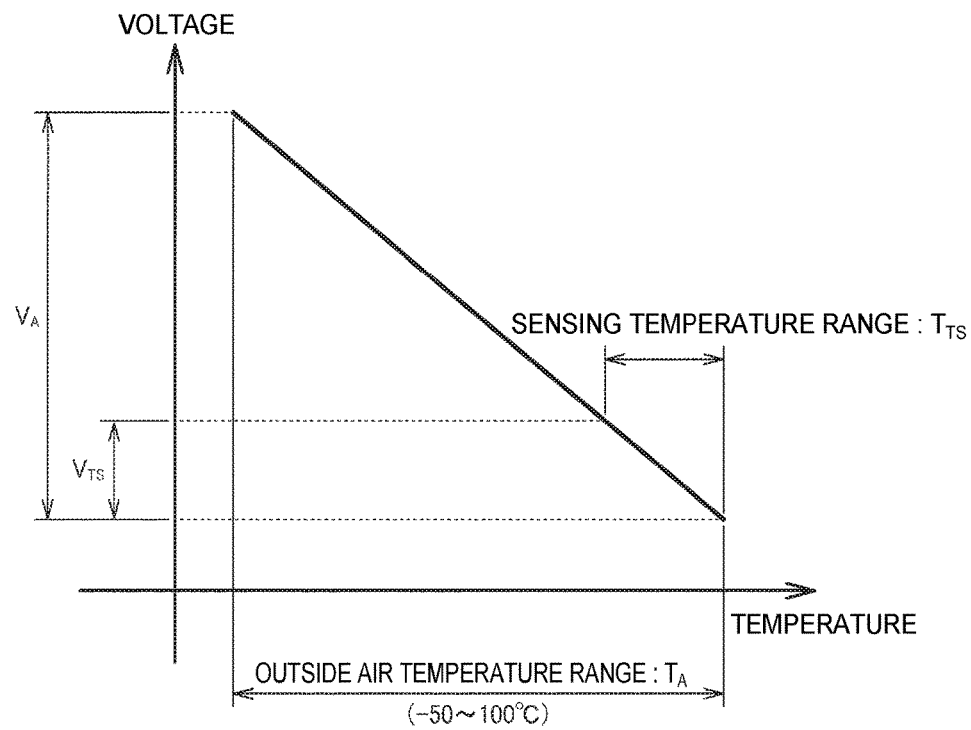
FIG. 2 is a diagram showing a characteristic example of a temperature detection voltage output by the temperature sensor.
Figure 3:
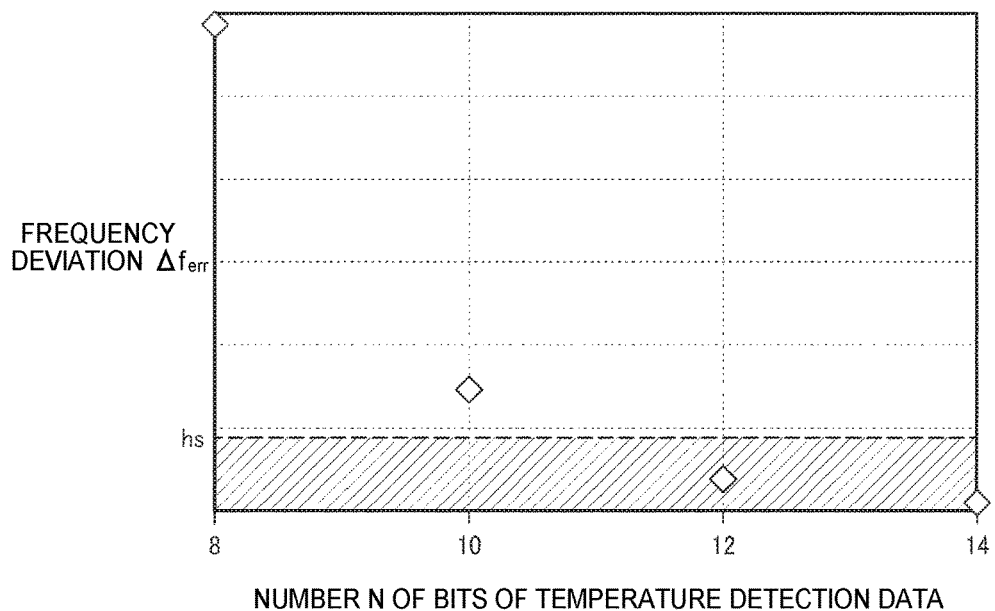
FIG. 3 is a diagram showing a characteristic example of a frequency deviation with respect to the number of bits of the temperature detection data.

The more specific description will be presented using FIG. 2 and FIG. 3. FIG. 2 is a diagram showing a characteristic example of the temperature detection voltage output by the temperature sensor. For example, the temperature detection voltage varies linearly (along a linear function) with a negative gradient with respect to the temperature.

As an example of the environmental temperature, there is assumed the outside air temperature, which is the temperature outside the package of the oscillator. In accordance with, for example, the specification of the oscillator, the variation range $T_A$ of the outside air temperature can be assumed as −50 degrees through 100 degrees (it should be noted that the temperatures are expressed in Celsius). With respect to the variation range $T_A$ of the outside air temperature, the variation range of the temperature detection voltage is assumed as $V_A$.

Incidentally, the temperature at the position where the temperature sensor is disposed is different in variation range $T_{TS}$ in accordance with the position. Since the temperature compensation is for compensating the variation of the oscillation frequency due to the change in temperature of the resonator, in the related art, the temperature sensor is disposed in the vicinity of the resonator. Taking the oscillator shown in, for example, FIG. 9 as an example, in the related art, the temperature sensor is incorporated in the circuit device 500, and the circuit device 500 is housed in the thermostatic oven (e.g., a second container 414) together with a resonator 420.

Figure 9:
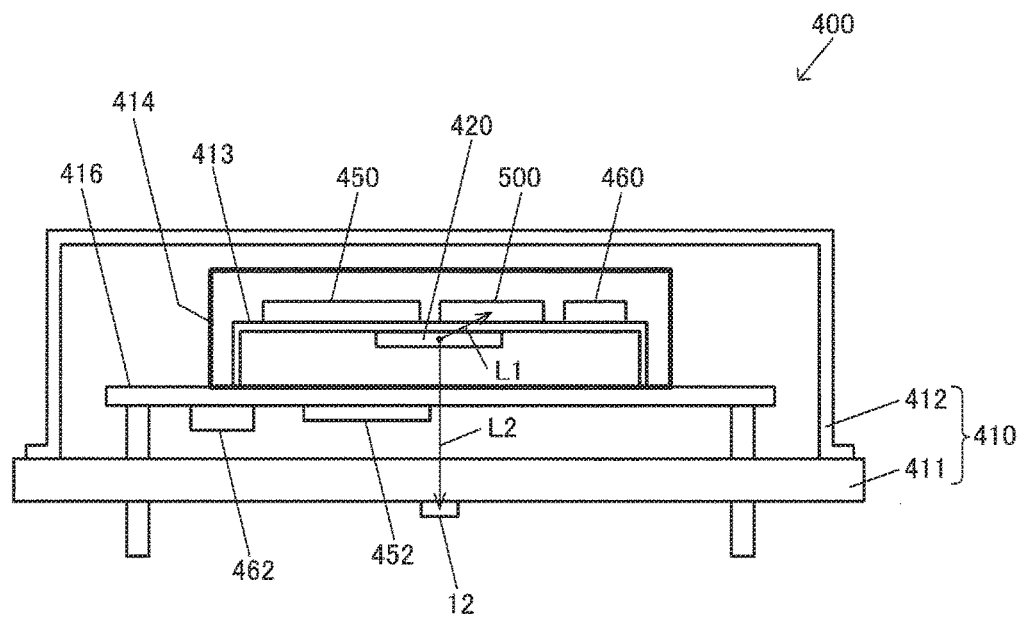
FIG. 9 is a diagram showing a detailed structural example of an oscillator.

However, in the case in which the temperature sensor (the circuit device 500) is disposed in the thermostatic oven, the variation range $T_{TS}$ of the sensing temperature at that position becomes extremely smaller than the variation range $T_A$ of the outside air temperature. For example, in a double oven type OCXO in which the temperature in the thermostatic oven is controlled using two heaters 450, 452 as shown in FIG. 9, the variation range $T_{TS}$ of the temperature in the thermostatic oven becomes extremely small, and the variation range $T_{TS}$ is, for example, 85 degrees through 95 degrees. As shown in FIG. 2, the variation range of the temperature detection voltage with respect to the variation range $T_{TS}$ of the sensing temperature is defined as $V_{TS}$. Defining the widths (the values each obtained by subtracting the lower limit of the range from the upper limit) of $T_{TS}$, $T_A$, $V_{TS}$, and $V_A$ as $\Delta T_{TS}$, $\Delta T_A$, $\Delta V_{TS}$, and $\Delta V_A$, $\Delta V_{TS}/\Delta V_A = \Delta T_{TS}/\Delta T_A = 10/150 = 1/15$ is true in the example described above. In other words, in the case of disposing the temperature sensor inside the thermostatic oven, the variation range of the temperature detection voltage becomes 1/15 compared to the case of disposing the temperature sensor in the outside air.

For example, it is assumed that the variation width of the output data DTD (the temperature detection data) of the A/D converter 20 is $2^{12}$ with respect to the voltage variation width $\Delta V_A$ at the outside air temperature. In this case, since $\Delta V_{TS}/\Delta V_A = 1/15$ is true, the variation width of the temperature detection data DTD becomes about $2^8$ with respect to the voltage variation width $\Delta V_{TS}$ at the sensing temperature. In other words, this is equivalent to the fact that the effective number of bits of the A/D converter 20 decreases as much as 4 bits, and thus, the resolution of the A/D converter 20 becomes insufficient for the frequency accuracy (the deviation of the oscillation frequency on which the temperature compensation has been performed) to be realized.

Specifically, a frequency correction error $\Delta f_{err}$[ppb] (ppb: parts per billion) caused by the temperature error $\Delta T_{err}$ [degree] in the temperature compensation process can be approximated as Formula (24) below. In the case in which it is assumed that, for example, the temperature characteristic of the oven-type resonator XTAL has a local maximum value and a local minimum value at an interval a half as large as the temperature variation range $\Delta T_A$, and at the same time, varies linearly, the approximation expressed by Formula (24) is possible. The frequency correction error $\Delta f_{err}$ is expressed as the deviation ($\Delta f/f$) with respect to a nominal oscillation frequency. The symbol $\Delta fw$ represents the deviation of the oscillation frequency in the case in which the outside air temperature varies in the range $T_A$ in the case in which the temperature compensation process by the processor 50 is not performed.

$$\Delta f_{err} = 2 \times \Delta fw / \Delta T_A \times \Delta T_{err} \qquad (24)$$

It is assumed that the temperature error $\Delta T_{err}$ is caused by the temperature resolution (the temperature change corresponding to 1 LSB, a temperature step) of the A/D converter 20. Assuming that the number of bits of the output data (the temperature detection data) of the A/D converter 20 is N, the temperature error $\Delta T_{err}$ is expressed by Formula (25) below.

$$\Delta T_{err} = \Delta T_A / 2^N \qquad (25)$$

According to Formulas (24), (25), the frequency correction error $\Delta f_{err}$ caused by the temperature resolution of the A/D converter 20 is expressed as Formula (26) below.

$$\Delta f_{err} = \Delta fw / 2^{N-1} \qquad (26)$$

FIG. 3 shows a characteristic example (the relationship of Formula (26) described above) of the frequency deviation $\Delta f_{err}$ with respect to the number N of bits of the temperature detection data.

As shown in FIG. 3, it is assumed that, for example, it is attempted that the frequency correction error $\Delta f_{err}$ is made to fulfill $\Delta f_{err} < hs = \Delta fw/1000$. In this case, according to Formula (26) described above, the number N of bits required for the A/D converter 20 becomes equal to or larger than 12 bits.

As is explained with reference to FIG. 2, in the case in which the (effective) number N of bits of the A/D converter 20 in the case of sensing the outside air temperature fulfills N=12, the (effective) number N of bits of the A/D converter 20 in the case of performing sensing in the double-oven type thermostatic oven becomes to roughly fulfill N=8. By applying the above to the example shown in FIG. 3, it is understood the fact that in the case of performing sensing in the double-oven type thermostatic oven, the desired frequency deviation hs cannot be obtained.

The frequency correction error $\Delta f_{err}$ in the case of N=8 becomes 16 times as large as the frequency correction error $\Delta f_{err}$ in the case of N=12. As described later with reference to Formulas (1), (2), in the hold-over state in which the oscillation circuit 150 oscillates in the free-running oscillation mode, the frequency deviation with respect to the nominal oscillation frequency is accumulated due to the frequency variation caused by the frequency correction error and so on (hold-over time $\theta_{tot}$ is elongated quadratically as the elapsed time $T_1$ increases). Therefore, the frequency correction error $\Delta f_{err}$, which has been made 16 times, makes the error in the time information in the hold-over state extremely large.

For example, even in the case of performing the temperature sensing in the thermostatic oven, it is possible to cite the method of amplifying the output of the temperature sensor with an amplifier to thereby increase the temperature resolution (the effective number N of bits of the A/D converter 20) of the temperature detection data. However, since it results that the small voltage variation is amplified by a high gain, there is a problem that the S/N ratio of the signal deteriorates. If the S/N ratio of the temperature detection voltage is low, the noise in the frequency control data DFCQ, on which the temperature compensation has been performed, also becomes high. Therefore, the phase noise of the oscillation signal OSCK becomes high.

In this regard, in the present embodiment, since the temperature sensor input terminal TVT is provided, it is possible to dispose the external temperature sensor 12 at a position where the temperature variation is large. Thus, it is possible to decrease the frequency correction error $\Delta f_{err}$ in the temperature compensation. For example, the hold-over time (the error in the time information) in the hold-over state decreases, and thus, the highly accurate time synchronization in the communication in the TDD system and so on can be realized.

2. Detailed Configuration of Circuit Device

Figure 4:
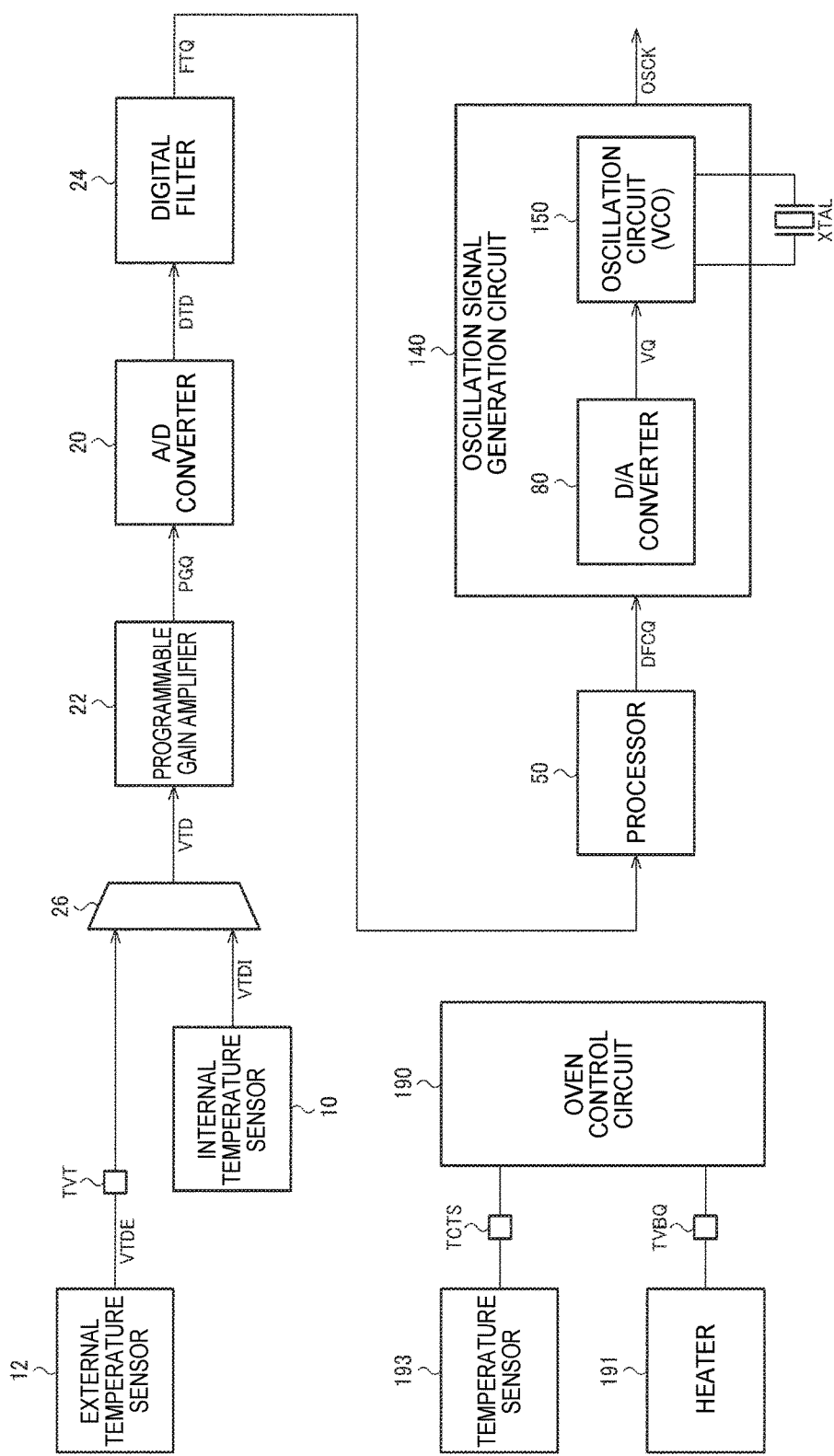
FIG. 4 is a diagram showing a detailed configuration example of the circuit device according to the embodiment.

FIG. 4 shows a detailed configuration example of the circuit device according to the present embodiment. The circuit device shown in FIG. 4 includes an internal temperature sensor 10 (a second temperature sensor), a selector 26, a programmable gain amplifier 22 (PGA, an amplifier circuit), a digital filter 24, an oven control circuit 190 (a heater control circuit) in addition to those shown in FIG. 1.

The internal temperature sensor 10 outputs a temperature detection voltage VTDI. Specifically, a temperature-dependent voltage varying in accordance with the temperature of the environment (the circuit device) is output as the temperature detection voltage VTDI. A specific configuration example of the internal temperature sensor 10 will be described later.

The selector 26 selects either one of the temperature detection voltage VTDE from the external temperature sensor 12 (the temperature sensor input terminal TVT) and the temperature detection voltage VTDI from the internal temperature sensor 10, and then outputs the temperature detection voltage thus selected as a temperature detection voltage VTD. For example, configuration information regarding which one of the temperature sensors is selected is set from an external device to a register unit (e.g., a register unit 32 shown in FIG. 13), and the selector 26 selects either one of the temperature detection voltages VTDE, VTDI based on the configuration information. Alternatively, it is also possible to store the configuration information in a storage (e.g., a storage 34 shown in FIG. 13) in advance. Alternatively, the circuit device includes a setting terminal not shown, to which a setting voltage is input from an external device or the like, and the selector 26 selects either one of the temperature detection voltages VTDE, VTDI based on the setting voltage.

The programmable gain amplifier 22 amplifies the temperature detection voltage VTD from the selector 26 by a variable gain, and then outputs a voltage PGQ thus amplified. The A/D converter 20 performs the A/D conversion of the voltage PGQ to output the temperature detection data DTD. A specific configuration example of the programmable gain amplifier 22 will be described later.

The digital filter 24 performs a digital filtering on the temperature detection data DTD from the A/D converter 20 to output data FTQ thus processed. The processor 50 performs the temperature compensation process of the oscillation frequency based on the data FTQ to output the frequency control data DFCQ thus processed. The digital filter 24 is a digital filter having, for example, a low-pass filter characteristic. The digital filter 24 is, for example, an infinite impulse response (IIR) type linear low-pass filter, and the transfer function H of this case is expressed as Formula (27) below.

$$H=(a_0+a_1 \times z^{-1})/(1+b_1 \times z^{-1}) \tag{27}$$

The symbols $a_0$, $a_1$, and $b_1$ are coefficients. The sampling frequency of the digital filter 24 is defined as fs, the cutoff frequency of the linear low-pass filter characteristic is defined as fc, and α is defined as α=2πfc/fs. In the case of using the bilinear transformation, the coefficients are set as a0=a1=α/(2+α), b1=−(2−α)/(2+α). These coefficients can be fixed values, or can also be variably set to the register unit or a storage (the register unit 32, the storage 34 shown in FIG. 13).

The digital filter 24 can be realized by an ASIC circuit such as a gate array, and can also be realized by a processor (e.g., DSP, CPU) and a program (a program module) running on the processor. For example, the digital filter 24 can also be realized by a gate array or processor integrated with the processor 50.

The oven control circuit 190 performs oven control of the oven type resonator XTAL (e.g., a double oven, or a single oven) having a thermostatic oven. For example, the oven control circuit 190 controls heating of a heater 191 (a heating element) for controlling the oven temperature. Specifically, the oven control circuit 190 controls heating of the heater 191 using a temperature sensor 193 for oven control disposed in accordance with the heater 191. Then, the oven control circuit 190 performs the temperature control so that the oven temperature becomes the preset temperature. The heater 191 and the temperature sensor 193 are disposed outside the circuit device. To the oven control circuit 190, there is input the temperature detection voltage from the temperature sensor 193 via a connection terminal TCTS, and the oven control circuit 190 outputs the heater control voltage to the heater 191 via an output terminal TVBQ. A specific configuration example of the oven control circuit 190, the heater 191, and the temperature sensor 193 will be described later.

In the single oven in which the oven control is performed using a single heater, there is provided a set of heater 191, temperature sensor 193, and terminals TCTS, TVBQ. In the double oven (having double thermostatic oven) in which the oven control is performed using two heaters, there are provided two sets of heater 191, temperature sensor 193, and terminals TCTS, TVBQ. In the case of the double oven, one of the two sets of heater 191 and temperature sensor 193 can be the same as, or different in type from the other of the two sets of heater 191 and temperature sensor 193.

According to the embodiment described above, the temperature detection voltage VTDE is input from the temperature sensor input terminal TVT to the A/D converter 20 via the programmable gain amplifier 22.

Specifically, in the case in which the external temperature sensor 12 is selected by the selector 26, the temperature detection voltage VTDE from the temperature sensor input terminal TVT is input to the A/D converter 20 via the programmable gain amplifier 22. Specifically, in the case in which the external temperature sensor 10 is selected by the selector 26, the temperature detection voltage VTDI from the temperature sensor input terminal TVT is input to the A/D converter 20 via the programmable gain amplifier 22.

There is a possibility that a variety of temperature sensors different in characteristics (e.g., sensitivity and an output voltage range) are connected as the external temperature sensor 12. Further, there is a possibility that the internal temperature sensor 10 is used. As described above, by providing the temperature sensor input terminal TVT, there is a possibility that the temperature sensors having a variety of characteristics are connected. In this regard, in the present embodiment, by disposing the programmable gain amplifier 22 in the anterior stage of the A/D converter 20, it is possible to adjust the gain in accordance with the temperature sensors having the variety of characteristics. Thus, the resolution of the temperature detection data DTD can be assured, and the desired oscillation frequency accuracy (the frequency correction error in the temperature compensation) can be obtained.

Further, the output voltage range of the temperature sensor also varies by the position where the external temperature sensor 12 is disposed. With respect thereto, by adjusting the gain with the programmable gain amplifier 22, the desired oscillation frequency accuracy can be obtained.

Figures 5, 6:
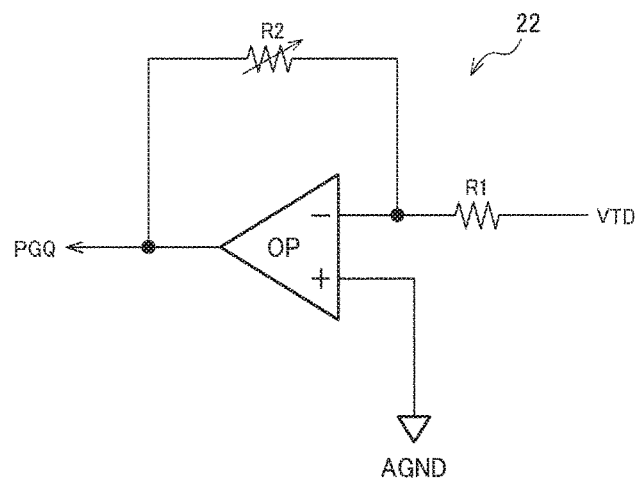
FIG. 5 is a diagram showing a gain setting example of a programmable gain amplifier.
FIG. 6 is a diagram showing a detailed configuration example of the programmable gain amplifier.

FIG. 5 shows a gain setting example of the programmable gain amplifier 22 (PGA). The sensing temperature widths $\Delta T_{TS}$ of 150 degrees, 70 degrees, 30 degrees, and 10 degrees correspond to the cases of assuming the outside air temperature (the outside of the package of an OCXO product), the inside of the package of a large-sized OCXO product, the inside of the package of a small-sized OCXO product, and the inside of a double oven, respectively. Here, the inside of the package is the inside of the package (a package 410 shown in FIG. 9) and the outside of the thermostatic oven (e.g., the second container 414).

In FIG. 5, there are described the gains in the respective sensing temperature widths $\Delta T_{TS}$ assuming that the gain in the case of detecting the outside air temperature with the external temperature sensor 12 is 1. The gains are necessary for obtaining the desired frequency correction error in the temperature compensation described with reference to FIG. 2 and FIG. 3. In other words, the gain is necessary for the variation width of the temperature detection data DTD with respect to the sensing temperature width $\Delta T_{TS}$ to be the variation width (e.g., $2^{12}$) necessary to obtain the desired frequency correction error. It should be noted that in FIG. 5, there is assumed the case in which the sensitivity (V/° C.) of the external temperature sensor 12 is 5.5 times of the sensitivity of the internal temperature sensor 10.

As described above, by adjusting the gain of the programmable gain amplifier 22 in accordance with the position where the external temperature sensor 12 is disposed, the desired frequency correction error in the temperature compensation can be obtained.

Further, although the internal temperature sensor 10 is disposed inside the double oven ($\Delta T_{TS}$=10 degrees), the gain roughly 15 times as high as that in the case of measuring the outside air temperature ($\Delta T_{TS}$=150 degrees) is necessary. It is understood that since the higher the gain is, the more the S/N ratio of the output voltage PGQ of the programmable gain amplifier 22 deteriorates, it is desirable to measure the outside air temperature or the temperature of the inside of the package (the outside of the double oven) using the external temperature sensor 12. In the present embodiment, by providing the temperature input terminal TVT, it becomes possible to perform the temperature detection with a low gain.

Further, in the present embodiment, the temperature detection data DTD from the A/D converter 20 is input to the processor 50 via the digital filter 24.

By performing the filtering on the temperature detection data DTD with the digital filter 24, the noise in the temperature detection data DTD can be reduced.

Specifically, noise is included in the temperature detection voltage from the external temperature sensor 12 and the internal temperature sensor 10. Further, since there is provided the programmable gain amplifier 22, the noise in the temperature detection voltage is amplified by the gain thereof. If the temperature compensation process is performed with the temperature detection voltage including the noise, it results that noise is also included in the frequency control data DFCQ. The noise in the frequency control data DFCQ deteriorates the characteristic (e.g., the phase noise) of the oscillation signal OSCK. In this regard, since in the present embodiment, the noise caused by the temperature detection voltage can be reduced with the digital filter 24, the characteristic of the oscillation signal OSCK can be improved.

Further, in the present embodiment, the circuit device includes the internal temperature sensor 10. Then, the A/D converter 20 performs the A/D conversion using the internal temperature detection voltage VTDI from the internal temperature sensor 10 as the temperature detection voltage VTD in a first mode. In the second mode, the A/D converter 20 performs the A/D conversion using the external temperature detection voltage VTDE input from the external temperature sensor 12 via the temperature sensor input terminal TVT as the temperature detection voltage VTD.

According to this configuration, it is possible to select an appropriate temperature sensor depending on, for example, the intended use of the oscillator. For example, in the case in which it is intended to reduce the cost without disposing the external temperature sensor, the internal temperature sensor can be selected. In contrast, in the case in which it is intended to obtain the highly accurate oscillation frequency, the external temperature sensor can be selected. In the present embodiment, since the programmable gain amplifier 22 is provided, it is possible to deal with such a variety of temperature sensors.

Further, in the present embodiment, the oven-type resonator XTAL can be a double oven-type resonator.

The double oven-type resonator is a resonator, which is provided with two heaters corresponding to the thermostatic ovens housing the resonator, and in which the temperatures in the thermostatic ovens are controlled at preset temperatures with the two heaters. By using such a double oven-type resonator, it is possible to make the temperature variation of the resonator small to suppress the variation of the oscillation frequency. However, since the temperature variation is small in the double oven, if the internal temperature sensor of the circuit device disposed in the double oven is used, the accuracy of the temperature compensation deteriorates. In this regard, in the present embodiment, since the temperature sensor input terminal TVT is provided, it becomes possible to dispose the external temperature sensor outside the double oven, and thus, the accuracy of the temperature compensation can be improved.

Further, in the present embodiment, the circuit device includes the oven control circuit 190 for controlling the heater (the heating element) disposed corresponding to the oven-type resonator XTAL.

By controlling heating of the heater with the oven control circuit 190, it is possible to realize the oven-type resonator XTAL with the temperature of the resonator controlled. In such an oven with the temperature controlled, the temperature variation is small. In the present embodiment, since the external temperature sensor can be provided, the highly accurate temperature compensation is achievable.

Further, in the present embodiment, as described later with reference to FIG. 15 and FIG. 16, frequency control data DFCI (the frequency control data input from a frequency control data generator to the processor 50) includes an aging variation component and a temperature variation component. The processor 50 extracts the aging variation component from the variation components of the frequency control data DFCI based on the temperature detection data DTD obtained from the temperature detection voltage VTD. Then, the processor 50 performs the aging correction process of the frequency control data DFCQ based on the aging variation component thus extracted.

In the present embodiment, since the temperature sensor input terminal TVT is provided, it is possible to use the external temperature sensor 12, and thus, it is possible to suppress the frequency correction error in the temperature compensation. Therefore, when extracting the aging variation component from the variation components of the frequency control data DFCI including the aging variation component and the temperature variation component, the aging variation component can accurately be extracted. Specifically, the temperature variation component is temperature compensation data (TCODE shown in FIG. 15) obtained by the temperature compensation process of the processor 50. In the present embodiment, since the temperature compensation data small in error can be obtained by using the external temperature sensor 12, the aging variation component can accurately be extracted.

3. Programmable Gain Amplifier

FIG. 6 shows a detailed configuration example of the programmable gain amplifier 22. The programmable gain amplifier 22 shown in FIG. 6 includes an operational amplifier OP and resistors R1, R2. The voltage AGND is a reference voltage (analog ground).

The programmable gain amplifier 22 is a so-called inverting amplifier circuit (an amplifier circuit with a negative gain), wherein the resistor R1 is an input resistor, and the resistor R2 is a feedback resistor. The feedback resistor R2 is a variable resistor, and the gain is variably set by adjusting the resistance value. It should be noted that it is also possible for the input resistor R1 to be a variable resistor.

For example, the feedback resistor R2 can be realized by a ladder resistor having a plurality of resistor elements connected in series to each other, and a switch circuit including switch elements connected to one ends of the respective resistor elements of the ladder resistor. By switching the switch elements of the switch circuit, the resistance value of the resistor connected between a negative input node (the first input node) and an output node of the operational amplifier OP varies to vary the gain. The variable resistance value is controlled based on, for example, a preset value set to the register unit or the storage (e.g., the register unit 32 or the storage 34 shown in FIG. 13).

4. Oven Control Circuit

Figure 7:
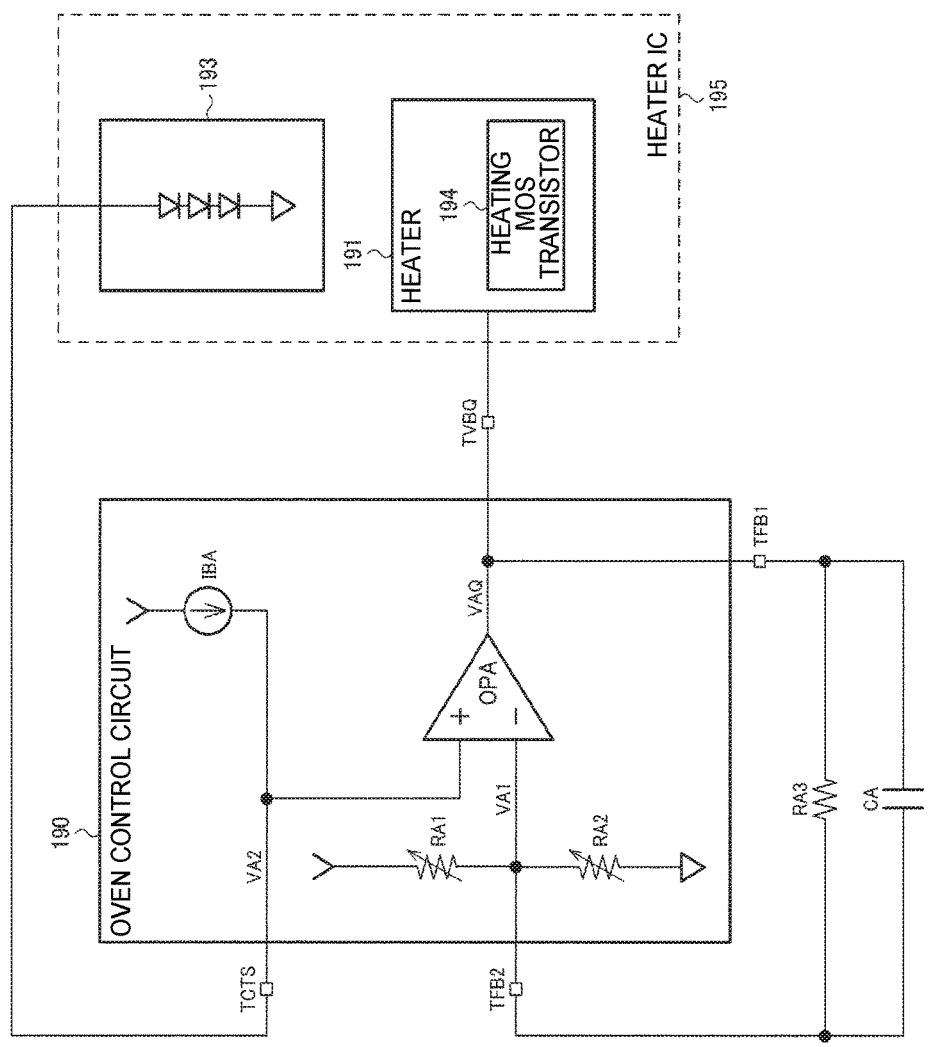
FIG. 7 is a diagram showing a first detailed configuration example of an oven control circuit.

FIG. 7 shows a first detailed configuration example of the oven control circuit 190. The oven control circuit 190 includes an operational amplifier OPA, a current source IBA (a current output circuit), and resistors RA1, RA2.

The temperature sensor 193 is a temperature sensor for the oven control, and is a temperature sensor (denoted by the reference numeral 460 or 462 shown in FIG. 9 described later) disposed inside the oscillator. In FIG. 7, the temperature sensor 193 is realized with a diode (a PN junction in a broad sense).

The temperature sensor 193 is connected to the oven control circuit 190 via the connection terminal TCTS. The current source IBA supplies the temperature sensor 193 with the bias current via the connection terminal TCTS, and the forward voltage VA2 of the diode is input to the oven control circuit 190 via the connection terminal TCTS. The current source IBA is, for example, a current mirror circuit.

The operational amplifier OPA, the resistors RA1, RA2, and RA3, and a capacitor CA constitute an integration circuit (a PI control circuit (proportional-integral controller)). The resistor RA3 and the capacitor CA are the feedback resistor and the feedback capacitor of the integration circuit, respectively, and are connected in parallel to each other between connection terminals TFB1, TFB2. The voltages VA1, VA2 of the connection terminals TFB2, TCTS are controlled so as to be equal to each other due to the imaginary short of the operational amplifier OPA. When the forward voltage VA2 of the diode as the temperature sensor 193 varies, the voltage VA1 of the connection terminal TCTS varies, and then the operational amplifier OPA operates so that the voltage VA1 and the voltage VA2 of the connection terminal TFB2 become equal to each other to thereby generate a heater control voltage VAQ. The resistors RA1, RA2 are variable resistors, and the oven temperature is set by the variable resistance value.

The heater control voltage VAQ generated by the oven control circuit 190 is output to the heater 191 (denoted by the reference numeral 450, 452 shown in FIG. 9) disposed inside the oscillator via the output terminal TVBQ. The heater 191 includes a heating MOS transistor 194 as a heating element. The gate voltage or the like of the heating MOS transistor 194 is controlled by the heater control voltage VAQ, and thus, the heating control of the heater 191 is realized.

It should be noted that the temperature sensor 193 and the heater 191 for the oven control can also be configured as a heater IC 195, which is a signal semiconductor chip.

Figure 8:
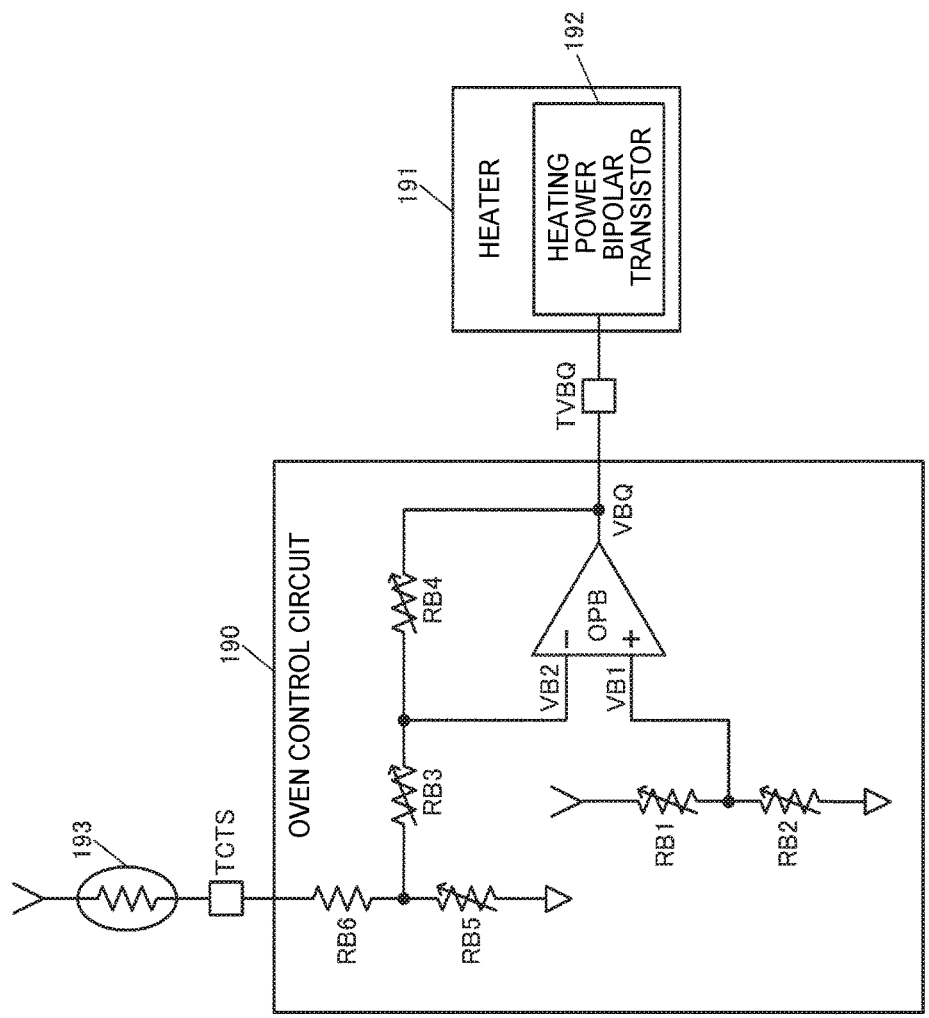
FIG. 8 is a diagram showing a second detailed configuration example of the oven control circuit.

FIG. 8 shows a second detailed configuration example of the oven control circuit 190. The oven control circuit 190 includes an operational amplifier OPB and resistors RB1 through RB6. The resistors RB1 through RB5 are resistors each having the resistance value controlled variably.

The temperature sensor 193 is a temperature sensor for the oven control, and is a temperature sensor (denoted by the reference numeral 460 or 462 shown in FIG. 9 described later) disposed inside the oscillator. In FIG. 8, the temperature sensor 193 is realized by a thermistor.

The temperature sensor 193 is connected to the oven control circuit 190 via the connection terminal TCTS.

Due to the resistive division of the power supply voltage using the resistors RB1, RB2, the voltage VB1 for setting the oven temperature is generated. Then, the resistance value of the thermistor, which is the temperature sensor 193, varies in accordance with the oven temperature of the oscillator, and thus, the voltage VB2 varies. The operational amplifier OPB operates so that the voltage VB2 and the voltage VB1 for setting the oven temperature become equal to each other due to the imaginary short, and thus, the heater control voltage VBQ is generated.

The heater control voltage VBQ generated by the oven control circuit 190 is output to the heater 191 (denoted by the reference numeral 450, 452 shown in FIG. 9) disposed inside the oscillator via the output terminal TVBQ. The heater 191 includes a heating power bipolar transistor 192 as a heating element. The base voltage or the like of the heating power bipolar transistor 192 is controlled by the heater control voltage VBQ, and thus, the heating control of the heater 191 is realized.

5. Oscillator

FIG. 9 shows a detailed structural example of the oscillator 400. The oscillator 400 shown in FIG. 9 is formed as an oscillator having a double oven structure (an oven structure in a broad sense).

The package 410 is formed of a substrate 411 and a case 412. On the substrate 411, there are mounted a variety of types of electronic components not shown. Inside the case 412, there is disposed the second container 414, and inside the second container 414, there is disposed a first container 413. Further, on an inner surface (a lower surface) of the top plate of the first container 413, there is mounted the resonator 420. Further, on an outer surface (an upper surface) of the top plate of the first container 413, there are mounted the circuit device 500, a heater 450, and the temperature sensor 460. Using the heater 450 (the heating element), the temperature of, for example, the inside of the second container 414 can be controlled. Further, using the temperature sensor 460, the temperature of, for example, the inside of the second container 414 can be detected.

The second container 414 is disposed on the substrate 416. The substrate 416 is a circuit board on which a variety of types of electronic components can be mounted. Among surfaces of the substrate 416, on the reverse side of the surface on which the second container 414, there are disposed the heater 452 and the temperature sensor 462. Using the heater 452 (the heating element), for example, the temperature of the space between the case 412 and the second container 414 can be controlled. Further, using the temperature sensor 462 the temperature of the space between the case 412 and the second container 414 can be detected.

As the heating element of the heater 450, 452, there can be used, for example, a heating power bipolar transistor, a heating heater MOS transistor, a heating resistive element, and a Peltier element. The heating control of these heaters 450, 452 can be realized by, for example, the oven control circuit of the circuit device 500. As the temperature sensor 460, 462, there can be used, for example, a thermistor and a diode.

The external temperature sensor 12 is disposed outside the package 410. Specifically, the external temperature sensor 12 is disposed on the lower surface of the substrate 411. The lower surface of the substrate 411 corresponds to a bottom surface of the package 410, and is a surface opposed to the circuit board in the case of mounting the oscillator on the circuit board.

In FIG. 9, since the temperature control of the resonator 420 and so on can be realized by the thermostatic oven having the double oven structure, the stabilization and so on of the oscillation frequency of the resonator 420 can be achieved. Further, since the external temperature sensor 12 is disposed outside the package 410, it becomes possible to detect the sensing temperature approximate to the outside air temperature.

In the present embodiment, in the case of defining the distance between the oven-type resonator (the resonator 420) and the circuit device 500 as L1, and the distance between the oven-type resonator and the external temperature sensor 12 as L2, L2>L1 is true.

Here, the distance represents, for example, the distance between the centers of the two constituents. In the case of, for example, the constituent having a rectangular shape in a planar view, it is sufficient to define the intersection between the diagonal lines of the rectangular shape as the center. Alternatively, the distance can also be the distance between the closest parts of the two constituents. Alternatively, in the distance L1 between the oven-type resonator and the circuit device 500, the distance L1 can also be the distance between the oven-type resonator and the internal temperature sensor 10 (the position where the internal temperature sensor 10 is disposed in the circuit device 500).

In the oven-type resonator, the temperatures of the inside of the containers 413, 414 housing the resonator 420 are controlled by the heaters 450, 452, respectively. Therefore, the closer to the oven-type resonator, the more appropriately the temperature is controlled, and the further from the oven-type resonator, the more easily the temperature is varied due to the variation of the environmental temperature (e.g., the outside air temperature). In this regard, in the present embodiment, the external temperature sensor 12 is further than the circuit device 500 incorporating the internal temperature sensor 10. Further, the temperature sensor input terminal TVT for inputting the temperature detection voltage from such an external temperature sensor 12 is provided to the circuit device 500. Thus, it becomes possible to detect the temperature variation broader in variation range using the external temperature sensor 12, and by using the temperature detection voltage, the accurate temperature compensation process becomes possible.

Figure 10A:
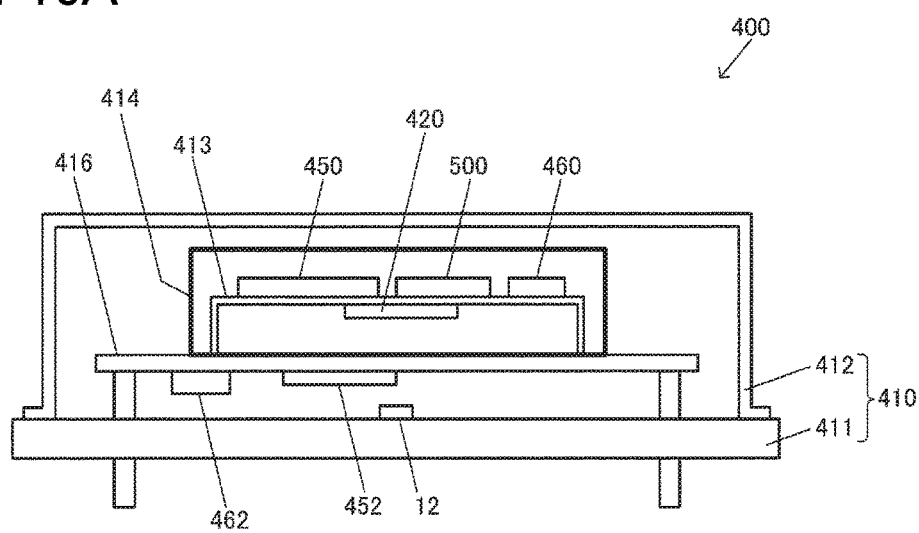
FIGS. 10A and 10B are diagrams each showing a modified structural example of the oscillator.
Figure 10B:
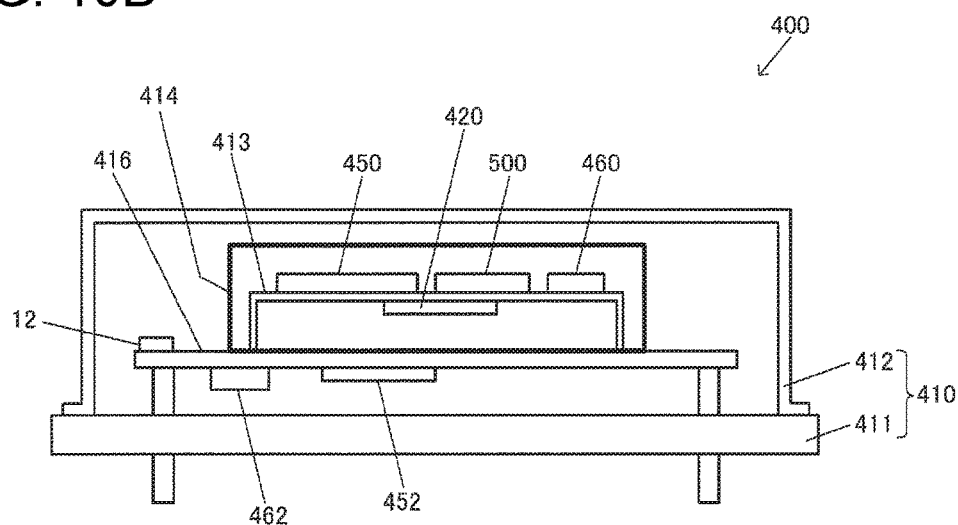

FIGS. 10A and 10B each show a modified structural example of the oscillator 400. In FIGS. 10A and 10B, the external temperature sensor 12 is disposed inside the package 410, and is disposed outside the second container 414. Specifically, in FIG. 10A, the external temperature sensor 12 is disposed on the upper surface (the surface opposed to the substrate 416) of the substrate 411. In FIG. 10B, the external temperature sensor 12 is disposed on the upper surface (the surface on which the second container 414 is disposed) of the substrate 416.

The case 412 of the package 410 is formed of, for example, metal, and is small in heat insulating effect compared to the material such as ceramic. Therefore, even in the inside of the package 410, by disposing the external sensor 12 outside the second container 414, the variation range of the sensing temperature can be increased. In this case, the variation range of the sensing temperature is in between the variation range of the outside air temperature and the variation range of the temperature in the inside of the second container 414. It should be noted that the external temperature sensor 12 is also disposed in FIGS. 10A and 10B so that the condition of L2>L1 described above is fulfilled.

6. Oscillation Frequency Variation Due to Aging

In the oscillator such as OCXO or TCXO, the oscillation frequency varies due to a secular change called aging. Further, in the behavior of the aging variation of the oscillation frequency, there is a difference between the individual oscillators caused by an individual variation (hereinafter referred to as an element variation) such as the performance of a component constituting the oscillator, the mounting state of the components and the oscillator, or a usage environment of the oscillator.

Figure 11:
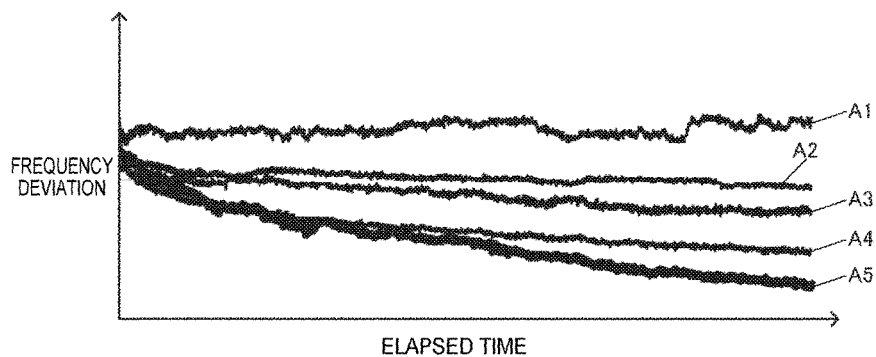
FIG. 11 is an explanatory diagram of an element variation in aging characteristic.

The symbols A1 through A5 shown in FIG. 11 represent an example of the measurement result of the aging characteristics with respect to a plurality of oscillators the same as or different from each other in shipping lot. As represented by the symbols A1 through A5 shown in FIG. 11, in the state of the aging variation, there exists a difference due to the element variation.

The cause of the variation in the oscillation frequency due to the aging is said to be attachment and detachment of power dust to and from the resonator occurring inside an airtightly sealed container, an environmental variation due to some outgas, or an aging deterioration of the adhesive used for the oscillator.

As the counter measure for suppressing such a variation in the oscillation frequency due to aging, there can be cited a method of performing initial aging of operating the oscillator for a predetermined period before shipment to cause an initial variation in the oscillation frequency, and then shipping the oscillator. However, in the use requiring high frequency stability, such a counter measure with the initial aging alone is insufficient, and there is demanded an aging correction for compensating the variation in the oscillation frequency due to aging.

Further, besides the above, in the case of using the oscillator as a reference signal source for a base station, there is a problem of so-called hold-over. For example, in the base station, by synchronizing the oscillation signal (the output signal) of the oscillator with the reference signal from the GPS or the network using the PLL circuit, the frequency variation is suppressed. However, if the hold-over, in which the reference signal from the GPS or the network (the Internet) disappears or becomes abnormal, occurs, it becomes unachievable to obtain the reference signal for the synchronization.

If such hold-over occurs, the oscillation signal due to the free-running oscillation of the oscillator is used as the reference signal source of the base station. Therefore, in the hold-over period from the timing at which the hold-over occurs to the timing (release timing) at which the restoration from the hold-over occurs, there is required the hold-over performance of suppressing the variation in oscillation frequency due to the free-running oscillation of the oscillator.

However, as described above, since the oscillator has the variation with a nonnegligible level in the oscillation frequency due to aging, there is a problem that it is difficult to realize the high hold-over performance due to the variation in the oscillation frequency. In the case in which the allowable frequency deviation (Δf/f) is regulated in the hold-over period such as 24 hours, if there occurs a significant variation in the oscillation frequency due to aging, there is a possibility that it becomes unachievable to satisfy the regulation of the allowable frequency deviation.

For example, as a communication system between the base station and the communication terminal, there have been proposed a variety of systems such as FDD (frequency division duplex) or TDD (time division duplex). Further, in the TDD system, data is transmitted and received in a time division manner using the same frequency between the uplink and the downlink, and the guard time is set between the time slots assigned to the respective devices. Therefore, in order to realize the appropriate communication, it is necessary to perform the time synchronization in each device, and timing of accurate absolute time is required.

Figure 12A:
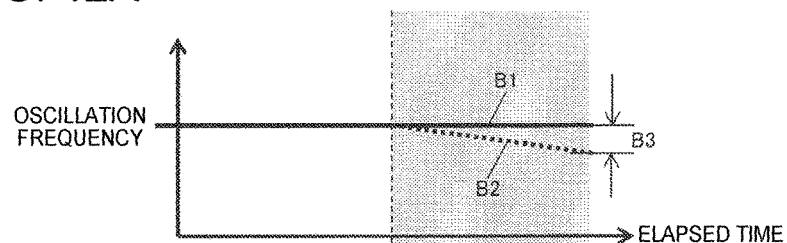
FIGS. 12A and 12B are explanatory diagrams related to hold-over.
Figure 12B:
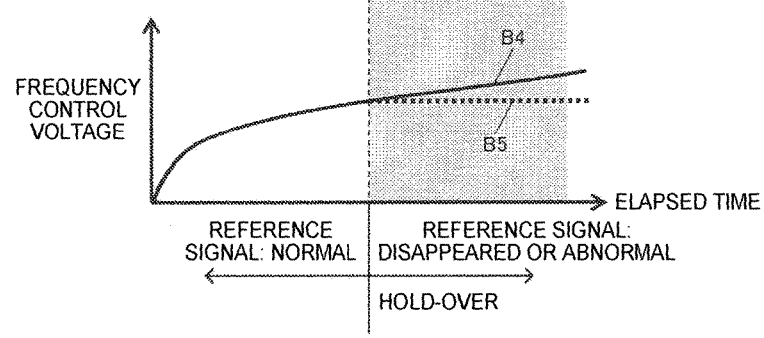

The reference symbol B1 shown in FIG. 12A represents the ideal characteristic of the aging of the oscillation frequency in the case in which the hold-over has occurred. In contrast, the reference symbol B2 (the dotted line) represents the characteristic of the oscillation frequency varying due to aging. The reference symbol B3 represents the variation width of the oscillation frequency due to aging. Further, the reference symbol B4 shown in FIG. 12B represents the transition of the frequency control voltage for approximating the oscillation frequency to the characteristic represented by the reference symbol B1 in the case in which the hold-over has occurred. In contrast, the reference symbol B5 (the dotted line) represents the state in which the frequency control voltage is constant from the time point when the disappearance or abnormality of the reference signal has occurred.

In order to perform the correction of approximating the characteristic represented by the reference symbol B2 shown in FIG. 12A to the ideal characteristic represented by the reference symbol B1, the aging correction is performed. For example, due to the aging correction, by changing the frequency control voltage to the frequency control voltage represented by the reference symbol B4 shown in FIG. 12B, it is possible to perform the correction of approximating the characteristic represented by the reference symbol B2 shown in FIG. 12A to the ideal characteristic represented by the reference symbol B1, and by improving, for example, the correction accuracy, it is possible to correct the characteristic represented by the reference symbol B2 to the ideal characteristic represented by the reference symbol B1. In contrast, in the case in which the aging correction has not been performed as represented by the reference symbol B5 shown in FIG. 12B, the oscillation frequency varies in the hold-over period as represented by the reference symbol B2 shown in FIG. 12A, and if, for example, the required specification to the hold-over performance is as represented by the reference symbol B1 shown in FIG. 12A, it becomes unachievable to fulfill the requirement.

For example, the hold-over time $\theta_{tot}$ representing the shift amount (total amount) of the time based on the variation in the oscillation frequency during the hold-over period can be expressed as Formula (1) below.

$$\theta_{tot} = T_1 \times f_0 \times \frac{\Delta f}{f_0} \times \frac{1}{f_0} \times \frac{1}{2} \quad (1)$$
$$= T_1 \times \frac{\Delta f}{f_0} \times \frac{1}{2}$$

$$\frac{\Delta f}{f_0} = \frac{2 \times \theta_{tot}}{T_1} \quad (2)$$

Here, the symbol $T_1$ represents the elapsed time of aging due to the hold-over. The symbol $f_0$ represents the nominal oscillation frequency, and $\Delta f/f_0$ represents the frequency deviation. In Formula (1) described above, $T_1 \times f_0$ represents the total clock count, and $(\Delta f/f_0) \times (1/f_0)$ represents the shift amount of the timing in one clock. Further, the frequency deviation $\Delta f/f_0$ can be expressed as Formula (2) described above using the hold-over time $\theta_{tot}$ and the elapsed time $T_1$.

Here, the frequency deviation $\Delta f/f_0$ is assumed to vary with a constant gradient linearly with respect to the elapsed time. In this case, the hold-over time $\theta_{tot}$ increases quadratically as the elapsed time $T_1$ increases.

In the case of, for example, the TDD system, in order to prevent the time slots provided with the guard time from overlapping each other, the hold-over time is required to fulfill, for example, $\theta_{tot} < 1.5$ µs. Therefore, as is obvious from Formula (2) described above, it results that an extremely small value is required as the frequency deviation $\Delta f/f_0$ allowed for the oscillator. In particular, the longer the elapsed time $T_1$ becomes, the smaller value the allowable frequency deviation is required to take. For example, in the case in which the time assumed to be the time from the timing at which the hold-over occurs to the timing at which the restoration from the hold-over due to a maintenance operation is $T_1=24$ hours, it results that an extremely small value is required as the allowable frequency deviation. Further, since the frequency deviation $\Delta f/f_0$ includes the frequency deviation depending on the temperature, and the frequency deviation due to aging, in order to fulfill the requirement described above, the aging correction with extremely high accuracy becomes necessary.

7. Detailed Configuration Example of Circuit Device

Figure 13:
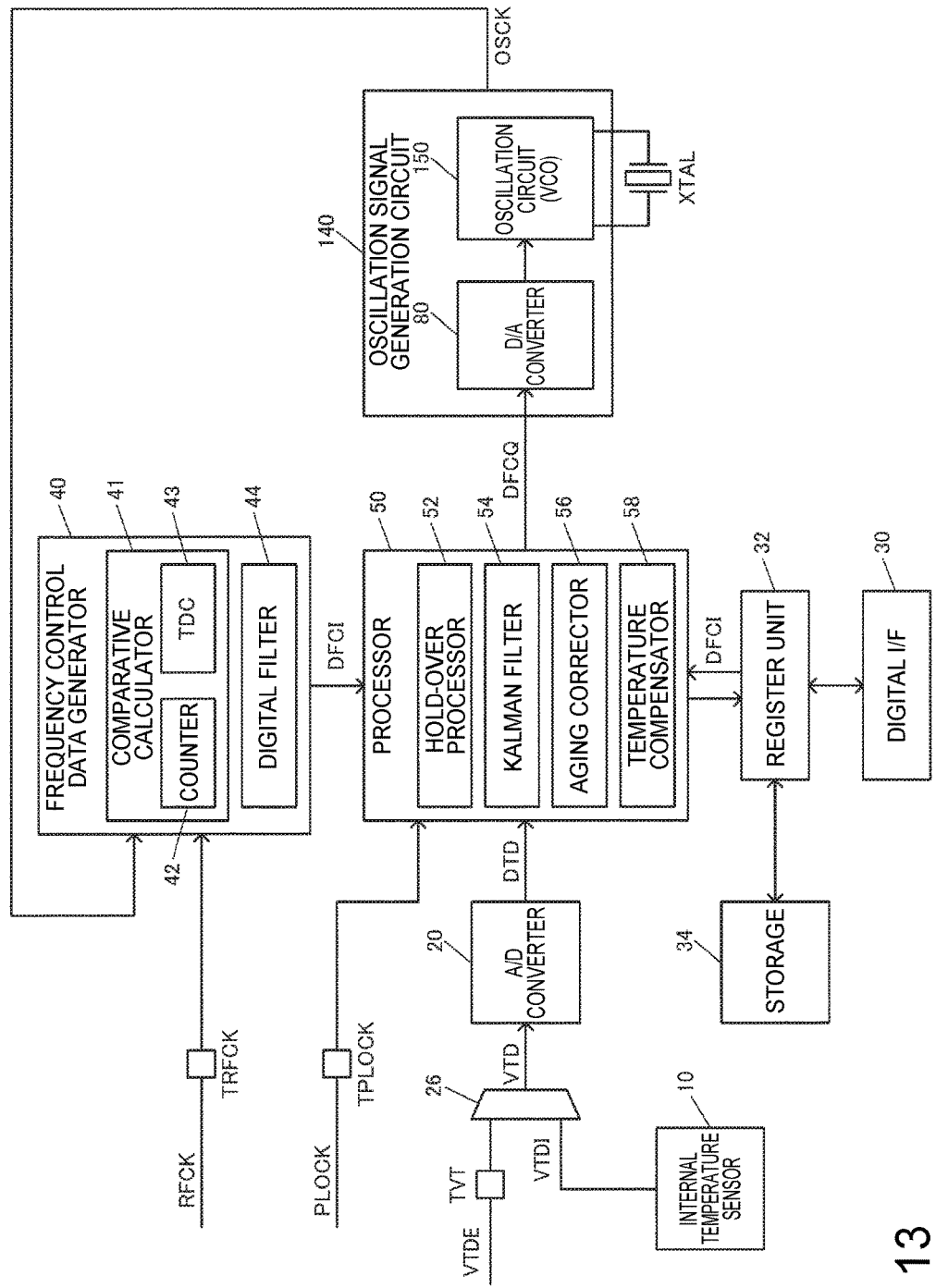
FIG. 13 is a diagram showing a detailed configuration example of the circuit device according to the embodiment.

FIG. 13 shows a detailed configuration example of the circuit device according to the present embodiment. In FIG. 13, in addition to the configuration shown in FIG. 4, there are further provided a digital I/F 30 (an interface, an interface circuit), the register unit 32 (register), the storage 34 (memory), and a frequency control data generator 40 (a frequency control data generation circuit). It should be noted that in FIG. 13, illustration of the programmable gain amplifier 22, the digital filter 24, and the oven control circuit 190 is omitted. The configuration of the circuit device is not limited to the configuration shown in FIG. 13, but a variety of practical modifications such as elimination of some of the constituents (e.g., the frequency control data generator) or addition of other constituents are possible.

The digital I/F 30 is an interface for inputting and outputting digital data between the circuit device and an external device (e.g., a microcomputer or a controller). The digital interface 30 can be realized by, for example, a synchronous serial communication system using a serial clock line and a serial data line. Specifically, it can be realized by an I²C (Inter-Integral Circuit) system, a three-line or four-line SPI (Serial Peripheral Interface) system, or the like. The I²C system is a synchronous serial communication system for performing communication with two signal lines, namely a serial clock line SCL and a bidirectional serial data line SDA. A plurality of slaves can be connected to the I²C bus, and a master designates the address of the slave determined individually to select the slave, and then performs the communication with the slave. The SPI system is a synchronous serial communication system for performing the communication with a serial clock line SCK, and two unidirectional serial data lines SDI, SDO. Although a plurality of slaves can be connected to the SPI bus, in order to designate the slaves, the master is required to select the slave using a slave select line. The digital I/F 30 is constituted by an input/output buffer circuit, a control circuit, and so on for realizing these communication systems.

The register unit 32 is a circuit constituted by a plurality of registers such as a status register, a command register, and a data register. The external device of the circuit device accesses the registers of the register unit 32 via the digital I/F 30. Further, it becomes possible for the external device to check the status of the circuit device, issue a command to the circuit device, transmit data to the circuit device, retrieve data from the circuit device, and so on using the registers of the register unit 32.

The storage 34 is for storing a variety of types of information necessary for a variety of types of processing and operations of the circuit device. The storage 34 can be realized by, for example, a nonvolatile memory. As the nonvolatile memory, there can be used, for example, an EEPROM. As the EEPROM, there can be used, for example, an MONOS (Metal-Oxide-Nitride-Oxide-Silicon) type memory. For example, a flash memory using the MONOS type memory can be used. Alternatively, as the EEPROM, it is also possible to use other types of memory such as a floating-gate type memory. It should be noted that the storage 34 is only required to be able to hold and store the information even if the power is not supplied, and can also be realized using, for example, a fuse circuit.

The processor 50 includes a hold-over processor 52 (a circuit or a program module for the hold-over process), a Kalman filter 54 (a circuit or a program module for the Kalman filtering), an aging corrector 56 (a circuit or a program module for the aging correction process), and a temperature compensator 58 (a circuit or a program module for the temperature compensation process). The hold-over processor 52 performs a variety of processes related to the hold-over. The temperature compensator 58 performs the temperature compensation process of the oscillation frequency based on the temperature detection data DTD from the A/D converter 20. Specifically, the temperature compensator 58 performs the temperature compensation process for decreasing the variation of the oscillation frequency in the case in which the temperature variation occurs, based on the temperature detection data DTD (the temperature-dependent data) varying in accordance with the temperature, coefficient data (data of the coefficients of an approximation function) for the temperature compensation processing, and so on.

The reference signal RFCK is input to the circuit device via the terminal TRFCK (pad), which is an external connection terminal of the circuit device. A signal PLOCK for giving notice of whether or not the external PLL circuit is in a locked state is input to the circuit device via the terminal TPLOCK (pad), which is an external connection terminal of the circuit device.

The storage 34 stores a system noise constant (V) for setting the system noise of the Kalman filtering, and an measurement noise constant (W) for setting the measurement noise of the Kalman filtering. For example, in the manufacture and the shipment of the product (the oscillator), there is performed the measurement (inspection) for monitoring the variety of types of information such as the oscillation frequency. Further, based on the measurement result, the system noise constant and the measurement noise constant are determined, and are written into the storage 34 realized by, for example, the nonvolatile memory. According to this configuration, it becomes possible to set the system noise constant and the measurement noise constant with the harmful influence due to the element variation reduced.

The frequency control data generator 40 generates the frequency control data DFCI. For example, the frequency control data generator 40 compares the input signal based on the oscillation signal OSCK and the reference signal RFCK with each other to generate the frequency control data DFCI. The frequency control data DFCI thus generated is input to the processor 50. Here, the input signal based on the oscillation signal OSCK can be the oscillation signal OSCK itself, or can also be a signal generated from the oscillation signal OSCK (e.g., a signal obtained by frequency-dividing the oscillation signal OSCK). Hereinafter, the description will be presented taking the case in which the input signal is the oscillation signal OSCK itself as an example.

The frequency control data generator 40 includes a comparative calculator 41, and a digital filter 44. The comparative calculator 41 is a circuit for performing a comparative calculation between the oscillation signal OSCK and the reference signal RFCK as the input signals, and includes a counter 42 and a time digital converter (TDC) 43.

The counter 42 generates digital data corresponding to a whole number part of the result obtained by dividing the reference frequency (e.g., 1 Hz) of the reference signal RFCK by the oscillation frequency of the oscillation signal OSCK. The TDC 43 generates the digital data corresponding to a fractional part of the division result. The TDC 43 includes, for example, a plurality of delay elements, a plurality of latch circuits for respectively latching the delayed clock signals output by the plurality of delay elements at edge (rising) timings of the reference signal RFCK, and a circuit for performing coding of the output signals of the plurality of latch circuits to generate the digital data corresponding to the fractional part of the division result. Then, the comparative calculator 41 adds the digital data corresponding to the whole number part from the counter 42 and the digital data corresponding to the fractional part from the TDC 43 to each other to thereby detect the phase error with respect to the preset frequency. Then the digital filter 44 performs a smoothing process of the phase error to thereby generate the frequency control data DFCI. In the case of, for example, defining the frequency of the oscillation signal OSCK as FOS, the frequency of the reference signal RFCK as FRF, and a frequency division number (frequency division ratio) corresponding to the preset frequency as FCW, the frequency control data DFCI is generated so that the relationship of FOS=FCW×FRF is true.

It should be noted that the configuration of the frequency control data generator 40 is not limited to the configuration shown in FIG. 13, but a variety of practical modifications can be adopted. For example, it is also possible to constitute the comparative calculator 41 by a phase comparator formed of an analog circuit, or to constitute the digital filter 44 by a filter (a loop filter) formed of an analog circuit.

Further, although in FIG. 13, there is adopted the configuration in which the circuit device incorporates the frequency control data generator 40, it is also possible for the frequency control data generator to be a circuit disposed outside the circuit device. In this case, it is sufficient to input the frequency control data DFCI from the frequency control data generator disposed externally to the processor 50 via the digital I/F 30.

As described above, in the present embodiment, to the processor 50, there is input the frequency control data DFCI from the frequency control data generator 40 for comparing the input signal based on the oscillation signal OSCK and the reference signal RFCK with each other to generate the frequency control data DFCI. Then, in the period before the hold-over due to the disappearance or the abnormality of the reference signal is detected, the processor 50 performs a process of estimating a true value with respect to a measured value of the frequency control data DFCI from the frequency control data generator 40 using the Kalman filtering. The true value is one estimated by the Kalman filtering, and is not necessarily the real true value. The Kalman filtering is performed by the Kalman filter 54. Further, the control process due to the detection of the hold-over is performed by the hold-over processor 52.

Then, in the case in which the hold-over has been detected, the processor 50 holds the true value at the timing corresponding to the detection timing of the hold-over. The timing for holding the true value can be the detection timing itself of the hold-over, or can also be a timing prior to that timing. Then, the processor 50 performs a calculation process based on the true value thus held to thereby generate the frequency control data DFCQ on which the aging correction has been performed. The frequency control data DFCQ thus generated is output to the oscillation signal generation circuit 140. The generation process of the frequency control data DFCQ on which the aging correction has been performed is performed by the aging corrector 56.

For example, in the normal operation period, the processor 50 performs signal processing such as the temperature compensation process on the frequency control data DFCI input from the frequency control data generator 40, and then outputs the frequency control data DFCQ on which the signal processing has been performed to the oscillation signal generation circuit 140. The oscillation signal generation circuit 140 uses the frequency control data DFCQ from the processor 50 and the resonator XTAL to generate the oscillation signal OSCK, and then outputs the oscillation signal OSCK to the frequency control data generator 40. Thus, there is formed a loop of the PLL circuit formed of the frequency control data generator 40, the oscillation signal generation circuit 140, and so on, and it becomes possible to generate the accurate oscillation signal OSCK synchronized in phase with the reference signal RFCK.

Further, in the present embodiment, even in the normal operation period before the hold-over is detected, the Kalman filter 54 of the processor 50 operates to perform the Kalman filtering on the frequency control data DFCI. Specifically, there is performed the process of estimating the true value with respect to the measured value of the frequency control data DFCI using the Kalman filtering.

When the hold-over is detected, the true value at the timing corresponding to the detection timing of the hold-over is held by the processor 50. Specifically, the aging corrector 56 holds the true value. Then, the aging corrector 56 performs the calculation process based on the true value thus held to thereby generate the frequency control data DFCQ on which the aging correction has been performed.

According to this configuration, since the aging correction is performed based on the true value at the timing corresponding to the detection timing of the hold-over, the accuracy of the aging correction can dramatically be improved. Therefore, it becomes possible to realize the aging correction taking the influence of the measurement noise and the system noise into consideration.

It should be noted that in the case in which the restoration from the hold-over state occurs, the oscillation signal generation circuit 140 generates the oscillation signal OSCK based on the frequency control data DFCQ input from the frequency control data generator 40 via the processor 50. For example, when the state in which the reference signal RFCK disappears is resolved, or the state in which the reference signal RFCK is abnormal is resolved, the hold-over state is resolved, and the restoration from the hold-over state occurs. In this case, the operation of the circuit device is restored to the normal operation. Then, the oscillation signal generation circuit 140 generates the oscillation signal OSCK based on the frequency control data DFCQ (the frequency control data on which the signal processing such as the temperature compensation process has been performed) input from the frequency control data generator 40 via the processor 50 instead of the frequency control data DFCQ generated by the processor 50 performing the aging correction.

Further, the processor 50 performs the calculation process (the calculation process for compensating the frequency variation due to aging) of adding a correction value to the true value thus held to thereby generate the frequency control data DFCQ on which the aging correction has been performed. For example, by sequentially adding the correction value (the correction value of canceling out the frequency variation due to an aging rate (the gradient of aging, an aging coefficient)) corresponding to the aging rate at every timing to the true value at the timing corresponding to the detection timing of the hold-over, the frequency control data DFCQ on which the aging correction has been performed is generated.

For example, the correction value at the time step k is defined as $D(k)$, and the frequency control data on which the aging correction has been performed at the time step k is defined as $AC(k)$. In this case, the processor 50 obtains the frequency control data $AC(k+1)$ on which the aging correction has been performed at the time step k+1 using the following formula. $AC(k+1)=AC(k)+D(k)$ The processor 50 performs the addition process of the correction values $D(k)$ at the respective time steps described above until the timing (the release timing) at which the restoration from the hold-over state occurs.

Further, the processor 50 performs the calculation process of adding the correction value, on which the filtering has been performed, to the true value. For example, the processor 50 performs the filtering such as a low-pass filtering on the correction values $D(k)$, and then performs the calculation process of sequentially adding the correction values $D'(k)$, on which the filtering has been performed, to the true value. Specifically, the processor 50 performs the calculation process expressed by the following formula:

$$AC(k+1)=AC(k)+D'(k)$$

Further, the processor 50 obtains the correction value based on the measurement residual in the Kalman filtering. For example, in the period before the hold-over is detected, the processor 50 performs the process of estimating the correction value for the aging correction based on the measurement residual. In the case of, for example, defining the measurement residual as ek, by performing the process expressed by the following formula, the correction values $D(k)$ are estimated. $D(k)=D(k-1)+E \cdot ek$ Here, the symbol E is, for example, a constant, but the Kalman gain can also be used instead of the constant E. Then, the processor 50 holds the correction value at the timing corresponding to the detection timing of the hold-over, and then performs the calculation process of adding the correction value thus held to the true value to thereby generate the frequency control data DFCQ on which the aging correction has been performed.

Further, the processor 50 determines whether or not the hold-over state has occurred based on a voltage of the input terminal to which a detection signal of the hold-over is input, or the detection information of the hold-over input via the digital I/F 30. These determination processes are performed by the hold-over processor 52. For example, the hold-over processor 52 includes a circuit of a state machine, and the state transition of the state machine is performed based on a variety of types of signals and information. Then, if it is determined that the hold-over state has occurred based on the voltage of the input terminal to which the detection signal of the hold-over is input, or the detection information of the hold-over input via the digital I/F 30, the state of the state machine makes the transition to the hold-over state. Then, the variety of types of processes (e.g., the aging correction) in the case of the hold-over are performed.

As the detection signal of the hold-over, there can be assumed, for example, the reference signal RFCK and the signal PLOCK. In this case, the processor 50 determines whether or not the hold-over state has occurred based on the voltage of the terminal TRFCK to which the reference signal RFCK is input, or the voltage of the terminal TPLOCK to which the signal PLOCK is input.

For example, in the case in which the PLL circuit is constituted by the frequency control data generator 40 disposed inside the circuit device, it is possible to determine whether or not the hold-over state has occurred based on the voltage of the terminal TRFCK to which the reference signal RFCK is input. For example, in the case in which it has been detected that the reference signal RFCK has disappeared or become in the abnormal state based on the voltage of the terminal TRFCK, the processor 50 determines that the hold-over state has occurred.

In contrast, in the case in which the PLL circuit is constituted by the frequency control data generator disposed outside the circuit device, it is possible to determine whether or not the hold-over state has occurred based on the voltage of the terminal TPLOCK to which the signal PLOCK is input. For example, the external device (the device for controlling the external PLL circuit) outputs the signal PLOCK for giving notice of whether or not the external PLL circuit is in the locked state to the circuit device. Then, in the case in which it has been determined that the external PLL circuit is not in the locked state based on the signal PLOCK, the processor 50 determines that the hold-over state has occurred. It should be noted that it is also possible to determine whether or not the hold-over state has occurred using the reference signal RFCK in addition to the signal PLOCK. Further, the external PLL circuit is a PLL circuit constituted by, for example, the frequency control data generator disposed outside the circuit device, and the oscillation signal generation circuit 140 of the circuit device.

Further, in the case in which the PLL circuit is constituted by the frequency control data generator disposed outside the circuit device, it is possible to determine whether or not the hold-over state has occurred based on the detection information of the hold-over input via the digital I/F 30. For example, in the case in which the external device (e.g., a microcomputer) for controlling the external PLL circuit has determined that the hold-over state has occurred due to the disappearance or the abnormality of the reference signal, the external device sets the detection information of the hold-over to the register (a notification register) of the register unit 32 via the digital I/F 30. The processor 50 retrieves the detection information of the hold-over set to the register to thereby determine whether or not the hold-over state has occurred. According to this configuration, it becomes unnecessary to newly dispose a terminal for detecting the hold-over, and it becomes possible to achieve reduction of the number of terminals of the circuit device.

8. Aging Correction Using Kalman Filtering

In the present embodiment, there is adopted the aging correction method using the Kalman filtering. Specifically, in the present embodiment, in the period before the hold-over is detected, the true value with respect to the measured value of the frequency control data (the oscillation frequency) is estimated by the Kalman filtering. Then, in the case in which the hold-over has been detected, the true value at the timing (time point) corresponding to the detection timing of the hold-over is held, and by performing the calculation process based on the true value thus held, the aging correction is realized.

Figure 14A:
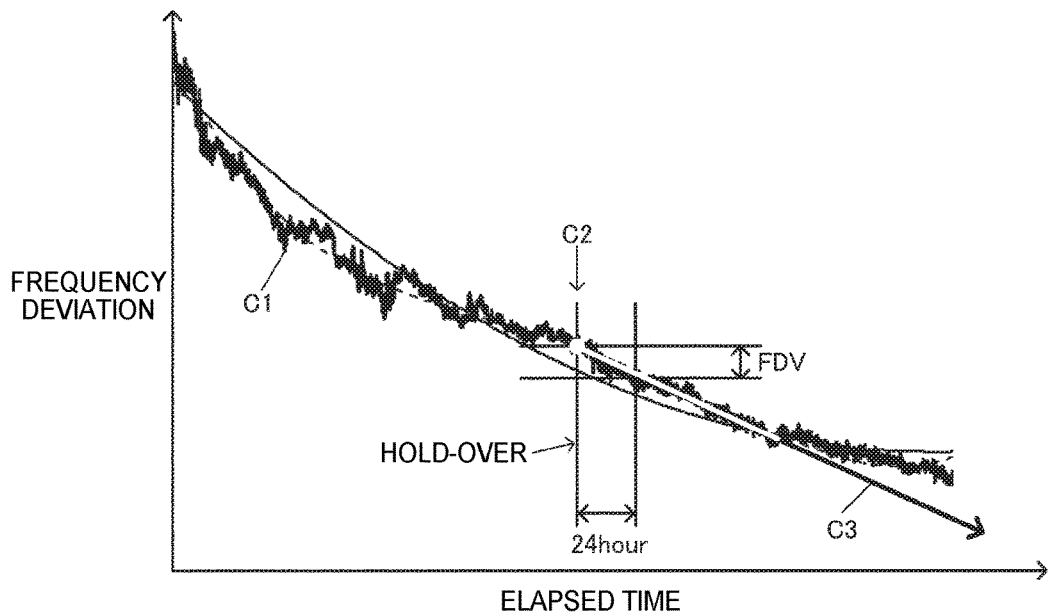
FIGS. 14A and 14B are explanatory diagrams of an aging correction using a Kalman filtering.

FIG. 14A is a diagram showing an example of the measurement result of the variation in the oscillation frequency due to aging. The horizontal axis represents the elapsed time (the aging time), and the vertical axis represents the frequency deviation ($\Delta f/f_0$) of the oscillation frequency. As represented by the symbol C1 shown in FIG. 14A, in the measurement value as the measured value, there exists a significant variation due to the system noise or the measurement noise. The variation includes a variation due to the environmental temperature.

In the circumstance in which the significant variation exists in the measurement value as described above, in order to correctly obtain the true value, in the present embodiment, there is performed the state estimation using the Kalman filtering (e.g., linear Kalman filtering).

Figure 14B:
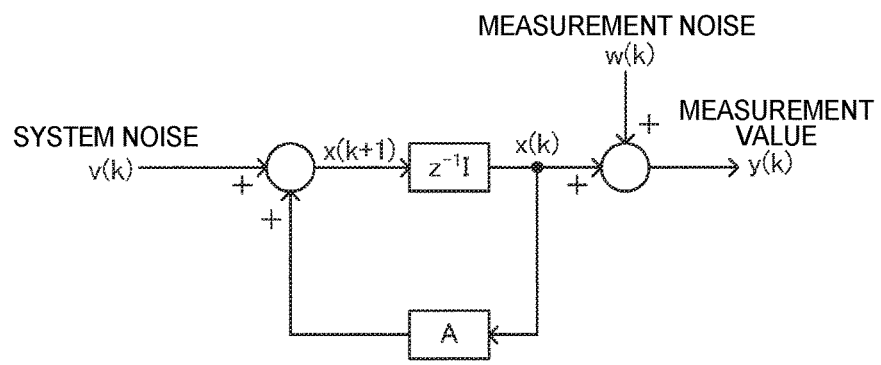

FIG. 14B is a diagram showing a time-series state space model, and the discrete-time state equation of this model is formed of the state equation and the measurement equation expressed as Formulas (3), (4) below.

$$x(k+1)=A \cdot x(k)+v(k) \quad (3)$$

$$y(k)=x(k)+w(k) \quad (4)$$

The symbol x(k) represents the state at the time point k, and the symbol y(k) represents the measured value. The symbol v(k) represents the system noise, the symbol w(k) represents the measurement noise, and the symbol A represents a system matrix. In the case in which x(k) represents the oscillation frequency (the frequency control data), the system matrix A corresponds to, for example, the aging rate (an aging coefficient). The aging rate represents the change ratio of the oscillation frequency with respect to the elapsed time.

For example, it is assumed that the hold-over has occurred at the timing indicated by the symbol C2 shown in FIG. 14A. In this case, the aging correction is performed based on the true state x(k) at the time point indicated by the symbol C2 at which the reference signal RFCK has been disrupted, and the aging rate (A) corresponding to the gradient indicated by the symbol C3 shown in FIG. 14A. Specifically, there is performed the aging correction of sequentially changing the true value x(k) of the oscillation frequency (the frequency control data) at the time point C2 with the correction value for canceling out the frequency variation as the compensation (correction) for decreasing the frequency variation at the aging rate indicated by C3. In other words, the true value x(k) is changed with the correction value with which the frequency variation at the aging rate represented by the symbol B2 shown in FIG. 12A is canceled out to obtain the ideal characteristic represented by the symbol B1. According to this configuration, in the case in which, for example, the period of the hold-over is 24 hours, it becomes possible to compensate the symbol FDV shown in FIG. 14A representing the variation in the oscillation frequency at the time point when 24 hours have elapsed using the aging correction.

Here, the variation in the oscillation frequency (the frequency deviation) represented by the symbol C1 shown in FIG. 14A includes the variation caused by the temperature variation and the variation caused by aging. Therefore, in the present embodiment, by adopting, for example, the oscillator (OCXO) having the oven structure including the thermostatic oven, the variation in the oscillation frequency due to the temperature variation is reduced to the minimum. Further, the temperature compensation process of reducing the variation in the oscillation frequency due to the temperature variation is performed using the external temperature sensor 12, the internal temperature sensor 10, and so on shown in FIG. 4.

Then, in the period (the normal operation period) in which the PLL circuit (the internal PLL circuit, the external PLL circuit) is synchronized with the reference signal RFCK, the frequency control data (the frequency control code) is monitored, the true value with the errors (the system noise, the measurement noise) removed is obtained and is held in the register. Then, in the case in which the PLL circuit is unlocked due to the disappearance or the abnormality of the reference signal RFCK, the aging correction is performed based on the true value (the true value with respect to the measured value of the frequency control data) held at the time point when the PLL is unlocked. For example, by performing the process of sequentially adding, for example, the correction value for canceling out the frequency variation to the true value of the frequency control data thus held as the compensation for reducing the frequency variation due to the aging rate, which is the gradient of the arrowed line C3 shown in FIG. 14A, the frequency control data DFCQ during the free-running oscillation in the hold-over period is generated to oscillate the resonator XTAL. According to this configuration, since it is possible to obtain the true value at the time point when the entry to the hold-over state occurs with the minimum error to perform the aging correction, it becomes possible to realize the hold-over performance with the harmful influence of the aging variation reduced to the minimum.

9. Configuration of Processor

Figure 15:
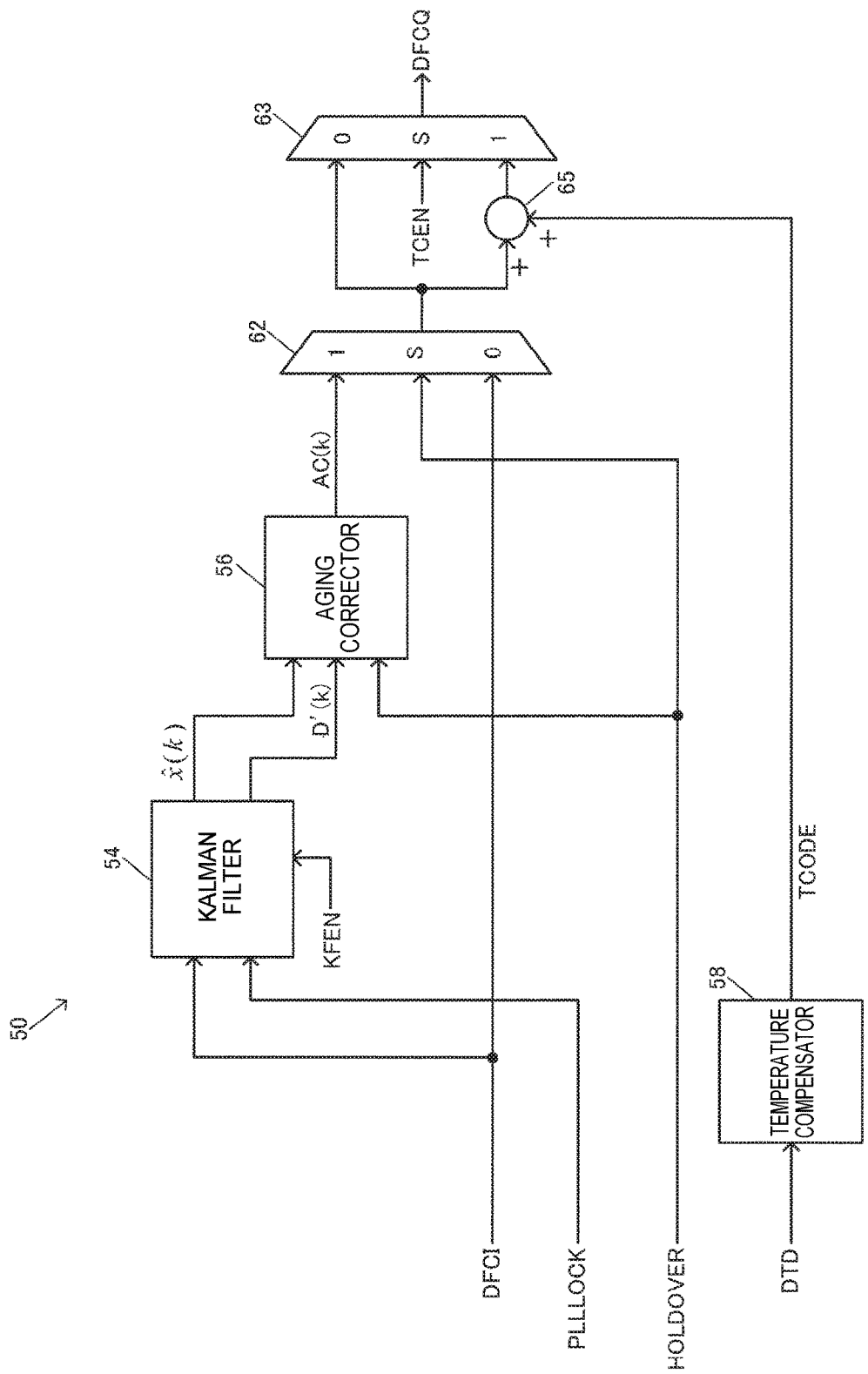
FIG. 15 is a diagram showing a detailed configuration example of a processor.

FIG. 15 shows a detailed configuration example of the processor 50. As shown in FIG. 15, the processor 50 includes the Kalman filter 54, the aging corrector 56, the temperature compensator 58, selectors 62, 63, and an adder 65.

To the Kalman filter 54, there is input the frequency control data DFCI (the frequency control data from which the environmental variation component is removed), and the Kalman filter 54 performs the Kalman filtering. Then, the Kalman filter 54 outputs a posterior estimate $\hat{x}$ (k) corresponding to the true value estimated by the Kalman filtering. It should be noted that in the present specification, the symbol of hat "^" representing an estimate is described adjacent to a character to form a pair of characters as needed.

The Kalman filtering is a process of assuming that a variable representing the measured value and a variable representing the state of the system include noise (an error), and estimating the optimum state of the system using the measured values obtained in the period from the past to the present. Specifically, the measurement update (the measurement process) and the time update (the predictive process) are repeatedly performed to estimate the state. The measurement update is a process of updating the Kalman gain, the estimate, and the error covariance using the measured value and the result of the time update. The time update is a process of predicting the estimate and the error covariance at the subsequent time point using the result of the measurement update. It should be noted that although in the present embodiment the method of using the linear Kalman filtering is mainly described, it is also possible to adopt extended Kalman filtering. The details of the Kalman filtering in the present embodiment will be described later.

To the aging corrector 56, there are input the posterior estimate $\hat{x}$ (k) and the correction value D' (k) from the Kalman filter 54. Then, the aging corrector 56 performs the calculation process of adding the correction value D' (k) to the posterior estimate $\hat{x}$ (k) corresponding to the true value of the frequency control data to thereby generate frequency control data AC(k) on which the aging correction has been performed. Here, D' (k) is obtained by performing the filtering (the low-pass filtering) on the correction value D(k). Specifically, in the case of defining the correction value (the correction value on which the filtering has been performed) at the time step k (time point k) as D' (k), and the frequency control data on which the aging correction has been performed at the time step k as AC(k), the aging corrector 56 obtains the frequency control data AC(k+1) on which the aging correction has been performed at the time step k+1 (the time point k+1) using the following formula:

$$AC(k+1)=AC(k)+D'(k).$$

To the temperature compensator 58, there is input the temperature detection data DTD, and then the temperature compensator 58 performs the temperature compensation process to generate the temperature compensation data TCODE (a temperature compensation code) for keeping the oscillation frequency constant with respect to the temperature variation.

The temperature characteristic of the oscillation frequency varies between the samples of the product. Therefore, in the inspection process when manufacturing or shipping the product (the oscillator), the temperature characteristic of the oscillation frequency, and the variation characteristic of the temperature detection data corresponding to the ambient temperature are measured. Then, the coefficients $A_0$ through $A_5$ of the polynomial (approximation function) of Formula (5) below are obtained based on the measurement result, and then, the information of the coefficients $A_0$ through $A_5$ thus obtained is written into the storage 34 (the nonvolatile memory) shown in FIG. 13 to thereby be stored in the storage 34.

$$TCODE=A_5 \cdot X^5+A_4 \cdot X^4+A_3 \cdot X^3+A_2 \cdot X^2+A_1 \cdot X+A_0 \qquad (5)$$

In Formula (5), the symbol X corresponds to the temperature detection data DTD (an A/D converted value) obtained by the A/D converter 20. Since the variation in the temperature detection data DTD corresponding to the variation in the ambient temperature is also measured, the ambient temperature and the oscillation frequency can be made to correspond to each other using the approximation function expressed by the polynomial of Formula (5) described above. The temperature compensator 58 retrieves the information of the coefficients $A_0$ through $A_5$ from the storage 34, and then perform the calculation process of Formula (5) described above based on the coefficients $A_0$ through $A_5$ and the temperature detection data DTD (=X) to thereby generate the temperature compensation data TCODE (the temperature compensation code). Thus, it is possible to realize the temperature compensation process for keeping the oscillation frequency constant with respect to the variation in the ambient temperature.

In the case in which the logic level of the input signal of the select terminal S is "1" (active), the selectors 62, 63 select the input signal of the terminal on the "1" side to output the input signal thus selected as an output signal. Further, in the case in which the logic level of the input signal of the select terminal S is "0" (inactive), the selectors 62, 63 select the input signal of the terminal on the "0" side to output the input signal thus selected as an output signal.

The signal KFEN is an enable signal for the Kalman filtering. In the case in which the signal KFEN is in the logic level of "1" (hereinafter simply described as "1"), the Kalman filter 54 performs the Kalman filtering. The signal PLLLOCK is a signal set to "1" in the case in which the PLL circuit is in the locked state. The signal HOLDOVER is a signal set to "1" during the hold-over period in which the hold-over has been detected.

The signal TCEN is an enable signal for the temperature compensation process. Hereinafter, the description will be presented mainly citing the case in which the signal TCEN is "1," and the selector 63 selects the input signal on the "1" side as an example. Further, it is assumed that the signal KFEN is also "1."

Since in the normal operation period, the signal HOLDOVER is in the logic level of "0" (hereinafter simply described as "0"), the selector 62 selects the frequency control data DFCI on the "0" terminal side. Then, the temperature compensation data TCODE is added by the adder 65 to the frequency control data DFCI, and then the frequency control data DFCQ on which the temperature compensation process has been performed is output to the oscillation signal generation circuit 140 in the posterior stage.

In contrast, during the hold-over period, the signal HOLDOVER is set to "1," and the selector 62 selects AC(k) on the "1" terminal side. The symbol AC(k) represents the frequency control data on which the aging correction has been performed.

Figures 16A, 16B:
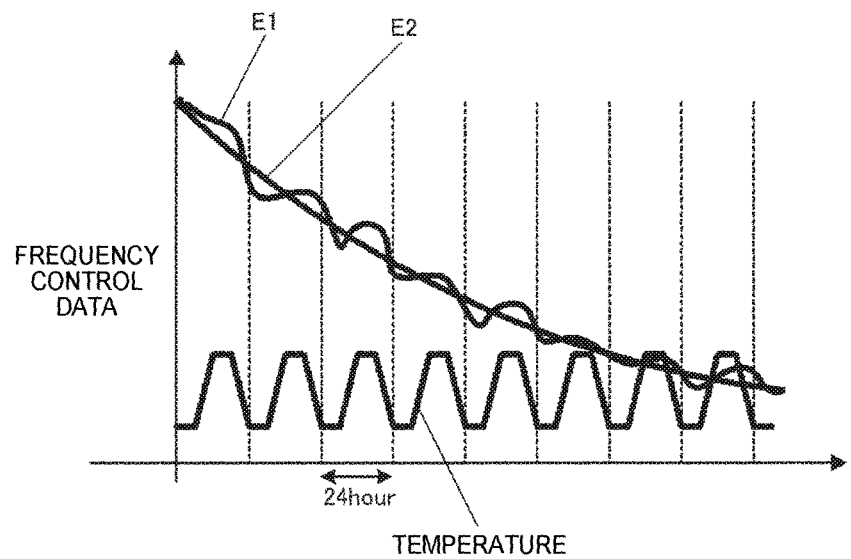
FIGS. 16A and 16B are operational explanatory diagrams of the processor.

FIG. 16A shows a truth table for explaining the operation of the Kalman filter 54. In the case in which both of the signals PLLLOCK, KFEN are "1," the Kalman filter 54 performs the true value estimation process (the Kalman filtering). Therefore, in the case in which the PLL circuit (the internal or external PLL circuit) is in the locked state during the normal operation period, the Kalman filter 54 continues to perform the true value estimation process of the frequency control data DFCI, which is the measured value.

Then, in the case in which the hold-over state has occurred, and the PLL circuit is unlocked to set the signal PLLLOCK to "0," the Kalman filter 54 holds the previous output state. For example, in FIG. 15, the Kalman filter holds and continues to output the values at the detection timing (the timing at which the PLL circuit is unlocked) of the hold-over as the posterior estimate x^ (k) estimated as the true value of the frequency control data DFCI, and the correction value D' (k) of the aging correction.

The aging corrector 56 performs the aging correction using the posterior estimate x^ (k) and the correction value D' (k) from the Kalman filter 54 in the hold-over period. Specifically, the aging corrector 56 performs the aging correction while holding the posterior estimate x^ (k) and the correction value D' (k) at the detection timing of the hold-over.

Further, in FIG. 15, to the Kalman filter 54, there is input the frequency control data DFCI from which the temperature variation component (the environmental variation component in a broad sense) is removed among the temperature variation component and the aging variation component. The Kalman filter 54 performs the Kalman filtering on the frequency control data DFCI from which the temperature variation component (the environmental variation component) is removed to estimate the true value with respect to the frequency control data DFCI. In other words, the posterior estimate x^ (k) is obtained. Then, the aging corrector 56 performs the aging correction based on the posterior estimate x^ (k) as the estimated true value. More specifically, the aging corrector 56 obtains the frequency control data AC(k) on which the aging correction has been performed based on the posterior estimate x^ (k) and the correction value D'(k) from the Kalman filter 54. Then, the frequency control data AC(k) on which the aging correction has been performed is input to the adder 65 via the selector 62, and then the adder 65 performs the process of adding the temperature compensation data TCODE (the compensating data for the environmental variation component) to the AC(k).

For example, as shown in the schematic diagram of FIG. 16B, if the temperature varies, the frequency control data also varies in accordance with the variation of the temperature as represented by the symbol E1. Therefore, if the Kalman filtering is performed using the frequency control data varying in accordance with the temperature variation as represented by the symbol E1, fluctuation occurs also in the true value at the detection timing of the hold-over.

Therefore, in the present embodiment, the frequency control data from which the temperature variation component is removed is obtained, and is then input to the Kalman filter 54. In other words, to the Kalman filter 54, there is input the frequency control data from which the temperature variation component (the environmental variation component) is removed among the temperature variation component and the aging variation component. In other words, the frequency control data represented by the symbol E2 shown in FIG. 16B is input. The frequency control data represented by the symbol E2 is the frequency control data from which the temperature variation component is removed, and in which the aging variation component remains.

The Kalman filter 54 performs the Kalman filtering on the frequency control data DFCI from which the temperature variation component is removed, and in which the aging variation component remains as described above, to thereby obtain the posterior estimate x^ (k) estimated as the true value and the correction value D' (k) of the aging correction. Then, the posterior estimate x^ (k) as the true value estimated at the detection timing of the hold-over and the correction value D' (k) are held in the aging corrector 56, and the aging correction is performed.

For example, by performing the process of adding the temperature compensation data TCODE using the adder 65, the frequency control data DFCQ turns to the frequency control data on which the temperature compensation has been performed. Therefore, it results that the oscillation signal generation circuit 140, to which the frequency control data DFCQ is input, outputs the oscillation signal OSCK with the oscillation frequency on which the temperature compensation has been performed. Therefore, it results that the frequency control data generator 40 shown in FIG. 13 and constituting the PLL circuit together with the oscillation signal generation circuit 140 supplies the processor 50 with the frequency control data DFCI from which the temperature variation component is removed as represented by the symbol E2 shown in FIG. 16B. Further, in the frequency control data DFCI from which the temperature variation component is removed, there remains the aging variation component varying with time elapsed as represented by the symbol E2 shown in FIG. 16B. Therefore, if the Kalman filter 54 of the processor 50 performs the Kalman filtering on the frequency control data DFCI in which the aging variation component remains, and the aging corrector 56 performs the aging correction based on the result of the Kalman filtering, it becomes possible to realize the highly accurate aging correction.

As is explained with reference to FIG. 1 and so on, in the present embodiment, since the temperature sensor input terminal TVT is provided, it becomes possible to obtain (perform the temperature compensation process) the temperature variation component based on the temperature detection voltage detected by the external temperature sensor 12. Thus, it is possible to obtain the temperature variation component higher in accuracy (smaller in frequency correction error) than in the case of using the temperature sensor incorporated in the circuit device, and by removing the temperature variation component from the frequency control data DFCI, the aging variation component can be extracted with high accuracy.

It should be noted that as a modified example of the configuration shown in FIG. 15, it is also possible to perform the calculation process for removing the temperature variation component (the environmental variation component) of the frequency control data DFCI without performing the addition process of the temperature compensation data TCODE in the adder 65, and then input the frequency control data DFCI, on which the calculation process has been performed, to the Kalman filter 54. For example, the configuration of the adder 65 and the selector 63 shown in FIG. 15 is omitted, a subtractor for subtracting the temperature compensation data TCODE from the frequency control data DFCI is disposed in the anterior stage of the Kalman filter 54, and the output of the subtractor is input to the Kalman filter 54. Further, an adder for adding the output of the aging corrector 56 and the temperature compensation data TCODE to each other is disposed between the aging corrector 56 and the selector 62, and the output of the adder is input to the terminal on the "1" side of the selector 62. According also to such a configuration, it becomes possible to input the frequency control data DFCI, from which the temperature variation component is removed, and in which only the aging variation component remains, to the Kalman filter 54.

Figure 17:
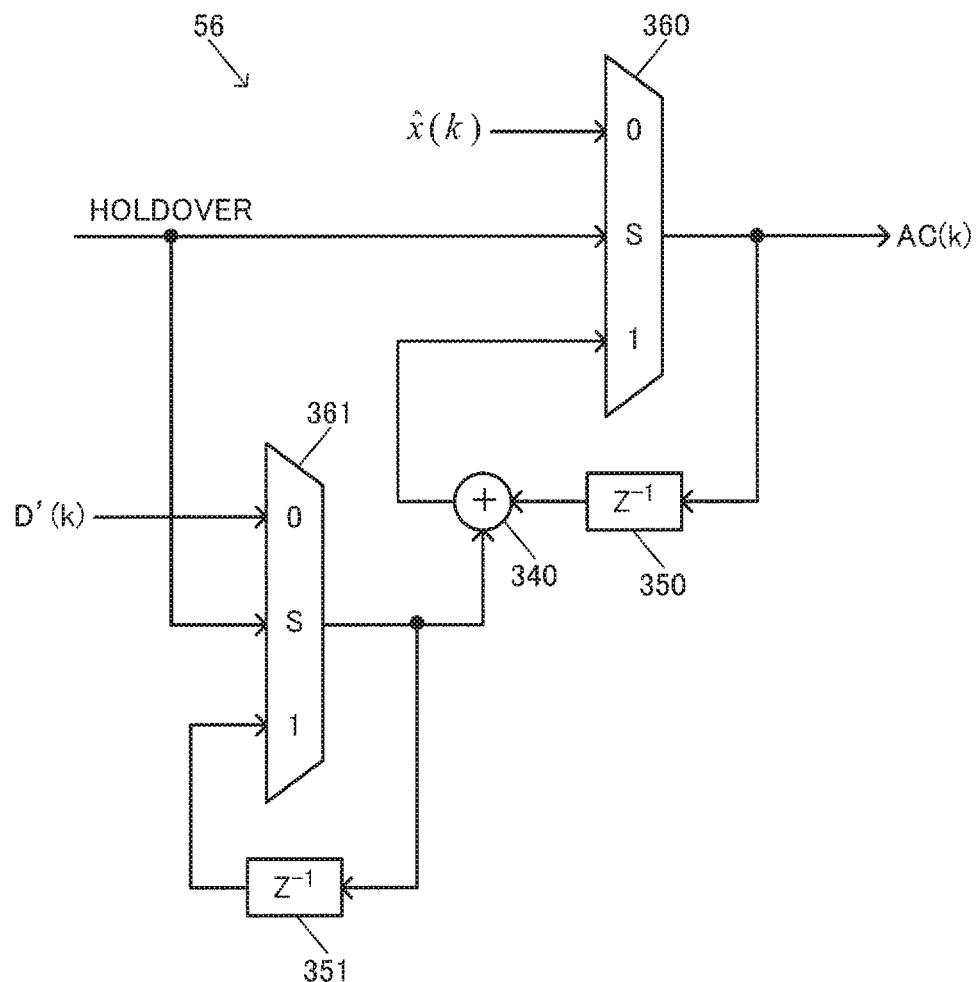
FIG. 17 is a diagram showing a configuration example of an aging corrector.

FIG. 17 shows a detailed configuration example of the aging corrector 56. In the normal operation period, since the signal HOLDOVER is set to "0," selectors 360, 361 each select the "0" terminal side. Thus, the posterior estimate x^ (k) and the correction value D' (k) (the correction value on which the filtering has been performed) calculated by the Kalman filter 54 during the normal operation period are held respectively in registers 350, 351.

When the hold-over is detected, and the signal HOLDOVER is set to "1," the selectors 360, 361 each select the "1" terminal side. Thus, it results that the selector 361 continues to output the correction value D' (k), which has been held in the register 351 at the detection timing of the hold-over, during the hold-over period.

Then, the adder 340 performs the process of sequentially adding the correction value D' (k) (the correction value), which is held in the register 351 and is output from the selector 361, to the posterior estimate x^ (k), which has been held in the register 350 at the detection timing of the hold-over, at every time step. Thus, the aging correction expressed as Formula (6) below is realized.

$$AC(k+1)=AC(k)+D'(k) \quad (6)$$

Specifically, the process of sequentially adding the correction value D' (k) for canceling out (compensating) the frequency variation due to the aging rate corresponding to the gradient of the arrowed line C3 to the posterior estimate x^ (k), which is the true value held at the timing of C2 shown in FIG. 14A is performed, and thus, the aging correction is realized.

10. Kalman Filtering

Then, the details of the Kalman filtering in the present embodiment will be described. The state equation and the measurement equation of the model of the Kalman filter are expressed as Formulas (7), (8) below.

$$x(k+1)=A \cdot x(k)+v(k) \quad (7)$$

$$y(k)=C^T \cdot x(k)+w(k) \quad (8)$$

The symbol k represents the time step as the discrete time. The symbol x(k) represents the state of the system at the time step k (the time point k), and is, for example, an n-dimensional vector. The symbol A represents a matrix called a system matrix. Specifically, the symbol A represents an n×n matrix, which correlates the state of the system at the time step k and the state of the system at the time step k+1 with each other in the case in which the system noise does not exist. The symbol v(k) represents the system noise. The symbol y(k) represents the measured value, and the symbol w(k) represents the measurement noise. The symbol C represents a measurement coefficient vector (n-dimensional), and the symbol T represents a transposed matrix.

In the Kalman filtering of the model expressed as Formulas (7), (8) described above, the process expressed as Formulas (9) through (13) below is performed to estimate the true value.

$$\hat{x}^-(k) = A\hat{x}(k-1) \quad (9)$$

$$P^-(k) = A \cdot P(k-1) \cdot A^T + v(k) \quad (10)$$

$$G(k) = \frac{P^-(k) \cdot C}{C^T \cdot P^-(k) \cdot C + w(k)} \quad (11)$$

$$\hat{x}(k) = \hat{x}^-(k) + G(k) \cdot (y(k) - C^T \cdot \hat{x}^-(k)) \quad (12)$$

$$P(k) = (1 - G(k) \cdot C^T) \cdot P^-(k) \quad (13)$$

x̂(k): posterior estimate
x̂⁻(k): advance estimate
P(k): posterior covariance
P⁻(k): advance covariance
G(k): Kalman gain
Formulas (9), (10) are expressions of time update (a predictive process), and Formulas (11) through (13) are expressions of measurement update (a measurement process). Every time the time step k, which is the discrete time, proceeds one step, the time update (Formulas (9), (10)) and the measurement update (Formulas (11) through (13)) of the Kalman filtering are performed once.

The symbols $\hat{x}^-(k)$, $\hat{x}^-(k-1)$ represent the posterior estimates of the Kalman filtering at the time steps k, k−1, respectively. The symbol $\hat{x0}^-(k)$ represents an advance estimate predicted before obtaining the measured value. The symbol P(k) represents the posterior covariance of the Kalman filtering, and the symbol P−(k) represents the advance covariance predicted before obtaining the measured value. The symbol G(k) represents the Kalman gain.

In the Kalman filtering, in the measurement update, the Kalman gain G(k) is obtained using Formula (11) described above. Further, based on the measured value y(k), the posterior estimate $\hat{x}^-(k)$ is updated using Formula (12) described above. Further, using Formula (13) described above, the posterior covariance P(k) of the error is updated.

Further, in the Kalman filtering, in the time update, as shown in Formula (9), based on the posterior estimate $\hat{x}^-(k-1)$ at the time step k−1 and the system matrix A, the advance estimate $\hat{x}^-(k)$ at the subsequent time step k is predicted. Further, as shown in Formula (10), based on the posterior variance P(k−1) at the time step k−1, the system matrix A, and the system noise v(k), the advance covariance P−(k) at the subsequent time step k is predicted.

Incidentally, if it is attempted to perform the Kalman filtering of Formulas (9) through (13), the processing load of the processor 50 becomes excessive, and the growth in scale of the circuit device is incurred in some cases. For example, in order to obtain the system matrix A in Formula (9) described above, namely $\hat{x}^-(k)=A\hat{x}^-(k-1)$, the extended Kalman filtering becomes necessary. Further, the extended Kalman filtering is extremely heavy in processing load, and if it is attempted to realize the processor 50 using the hardware capable of performing the extended Kalman filtering, the circuit area of the processor 50 apt to become extremely large. Therefore, it becomes inappropriate in the circumstance in which the miniaturization is strongly required for the circuit device to be incorporated in the oscillator. In contrast, if a scalar value as a fixed value is used as the system matrix A, the difficulty level in realizing the appropriate aging correction rises.

Therefore, as a solution in the case in which it is necessary to avoid such a circumstance, in the present embodiment, the Kalman filtering is realized by a process with Formulas (14) through (19) below instead of Formulas (9) through (13) described above. Specifically, the processor 50 (the Kalman filter 54) performs the Kalman filtering based on Formulas (14) through (19).

$$\hat{x}^-(k) = \hat{x}(k-1) + D(k-1) \tag{14}$$

$$P^-(k) = P(k-1) + v(k) \tag{15}$$

$$G(k) = \frac{P^-(k)}{P^-(k)+w(k)} \tag{16}$$

$$\hat{x}(k) = \hat{x}^-(k) + G(k)\cdot(y(k)-\hat{x}^-(k)) \tag{17}$$

$$P(k) = (1 - G(k))\cdot P^-(k) \tag{18}$$

$$D(k) = D(k-1) + E\cdot(y(k)-\hat{x}^-(k)) \tag{19}$$

It should be noted that in the present embodiment, the symbol x(k) to be the object of the estimation process of the true value is the frequency control data, and the measured value y(k) is also the frequency control data. Therefore, C=1 becomes true. Further, since the scalar value of the system matrix A is infinitely close to 1, Formula (15) described above can be used instead of Formula (10) described above.

As described above, compared to the case of adopting the extended Kalman filtering as the Kalman filtering, in the Kalman filtering of the present embodiment, as shown in Formula (14) described above, the advance estimate $\hat{x}^-(k)$ at the time step k is obtained by an addition process of the posterior estimate $\hat{x}^-(k-1)$ and the correction value D(k−1) at the time step k−1. Therefore, it is superior in the point that it becomes unnecessary to use the extended Kalman filtering, and it is possible to achieve reduction of processing load of the processor 50, and suppression of increase in circuit scale.

In the present embodiment, Formula (14) is derived due to the transformation of the formula described below.

$$\hat{x}^-(k) = A\hat{x}(k-1) \tag{20}$$

$$= \hat{x}(k-1) + (A-1)\cdot\hat{x}(k-1) \tag{21}$$

$$\approx \hat{x}(k-1) + (A-1)\cdot F_0 \tag{22}$$

$$= \hat{x}(k-1) + D(k-1) \tag{23}$$

For example, Formula (20) described above can be transformed as Formula (21) described above. Here, since (A−1) in Formula (21) described above becomes an extremely small number, the approximation of replacing (A−1) $\hat{x}(k-1)$ with $(A-1)\cdot F_0$ becomes possible as shown in Formulas (22), (23) described above. Further, $(A-1)\cdot F_0$ is substituted by the correction value D(k−1).

Then, as shown in Formula (19), in the time update from the time step k−1 to the time step k, the update process of the correction value D(k) described below is performed. D(k)=D(k−1)+E·(y(k)−$\hat{x}^-(k)$)=D(k−1)+E·ek Here, ek=y(k)−$\hat{x}^-(k)$ is a value called the measurement residual in the Kalman filtering. Further, the symbol E represents a constant. It should be noted that it is also possible to adopt the practical modification of using the Kalman gain G(k) instead of the constant E. In other words, it is also possible to adopt the following formula:

D(k)=D(k−1)+G(k)·ek.

As described above, in the case of defining the measurement residual as ek, and the constant as E, the correction value D(k) is obtained by the following formula. D(k)=D(k−1)+E·ek By adopting such a configuration, the update process of the correction value D(k) reflecting the measurement residual ek in the Kalman filtering becomes possible.

As described above, in the present embodiment, the processor 50 performs the process of obtaining the advance estimate $\hat{x}^-(k)$ at the present timing by the addition process of the posterior estimate $\hat{x}^-(k-1)$ and the correction value D(k−1) at the previous timing in the update process (the time update) of the advance estimate of the Kalman filtering as shown in Formula (14) described above. Then, based on the result of the Kalman filtering, the aging correction of the frequency control data is performed. Specifically, the addition process of the posterior estimate $\hat{x}^-(k-1)$ and the correction value D(k−1) at the time step k−1 as the previous timing is performed, to obtain the advance estimate $\hat{x}^-(k)$ at the time step k as the present timing using the following formula:

$\hat{x}^-(k)=\hat{x}^-(k-1)+D(k-1)$.

Then, the processor 50 (the aging corrector 56) performs the aging correction based on the result (the true value, the correction value) of the Kalman filtering. Specifically, in the case of defining the correction value at the time step k as D(k) (or D' (k)), and the frequency control data on which the aging correction has been performed at the time step k as AC(k), the processor 50 obtains the frequency control data AC(k+1) on which the aging correction has been performed at the time step k+1 using the following formula:

$$AC(k+1)=AC(k)+D(k)(\text{or } AC(k)+D'(k)).$$

Further, as shown in Formula (19) described above, the processor 50 obtains the correction value D(k) at the present timing based on the correction value D(k−1) at the previous timing and the measurement residual ek in the Kalman filtering. For example, by performing the process of adding E·ek (or G(k)·ek) as the value based on the measurement residual to the correction value D(k−1) at the previous timing, the processor 50 obtains the correction value D(k) at the present timing. Specifically, the processor 50 obtains the correction value D(k) at the time step k as the present timing based on the correction value D(k−1) at the time step k−1 as the previous timing and the measurement residual ek in the Kalman filtering. For example, in the case of defining the measurement residual as ek, and the constant as E, the correction value D(k) is obtained by the following formula:

$$D(k)=D(k-1)+E\cdot ek.$$

For example, in the present embodiment, as is explained with reference to FIG. 16B, the environmental variation component information such as the temperature variation component information is obtained, and then the frequency control data, from which the environmental variation component is removed among the environmental variation component and the aging variation component, is obtained using the environmental variation component information thus obtained. Here, the environmental variation component information can also be the information regarding a power supply voltage variation component, an atmospheric pressure variation component, a gravitational force variation component, or the like. Then, based on the frequency control data from which the environmental variation component is removed, the aging correction is performed. Specifically, it is assumed that the environmental variation component is the temperature. In this case, based on the temperature detection data DTD obtained by the temperature detection voltage VTD from the external temperature sensor 12 or the internal temperature sensor 10 shown in FIG. 4 as the environmental variation information acquisition unit for obtaining the environmental variation component information, the temperature variation component information as the environmental variation component information is obtained. Then, the frequency control data from which the temperature variation component is removed is obtained using the temperature variation component information thus obtained. For example, the temperature compensator 58 obtains the temperature compensation data TCODE, and the adder 65 performs the addition process of the temperature compensation data TCODE, and thus, the frequency control data DFCI from which the temperature variation component is removed is input from the frequency control data generator 40, and is obtained by the processor 50. In other words, as represented by the symbol E2 shown in FIG. 16B, the frequency control data DFCI, from which the temperature variation component is removed on the one hand, and in which the aging variation component remains on the other hand, is obtained and is input to the Kalman filter 54.

It should be noted that the frequency control data from which the environmental variation component is removed includes the frequency control data in the state in which the negligible level of environmental variation component is included in the frequency control data besides the frequency control data in the preferable state in which the environmental variation component is completely removed.

The environmental variation component information such as the temperature variation component information or the power supply voltage variation component information can be obtained by the temperature sensor, the voltage detection circuit, and so on as the environmental variation information acquisition unit for detecting the environmental variation component information. In contrast, the aging variation component is the variation component of the oscillation frequency varying with time, and it is difficult to directly detect the information of the aging variation component with a sensor or the like.

Therefore, in the present embodiment, the environmental variation component information such as the temperature variation component information which can be detected by a sensor or the like is obtained, and then the frequency control data, from which the environmental variation component is removed among the environmental variation component and the aging variation component, is obtained using the environmental variation component information.

Specifically, by performing the process (e.g., the addition process by the adder 65) of removing the environmental variation component from the variation components of the frequency control data, it is possible to obtain the frequency control data in which only the aging variation component remains as represented by the symbol E2 shown in FIG. 16B. Further, by performing the Kalman filtering or the like based on the frequency control data in which the aging variation component remains, the true value with respect to the frequency control data can be estimated. Further, by performing the aging correction based on the true value estimated in such a manner, it becomes possible to realize a highly accurate aging correction which cannot be realized in the related art example.

As described above, in the present embodiment, the frequency control data DFCI, from which the temperature variation component (the environmental variation component) is removed on the one hand, and in which the aging variation component remains on the other hand, is input to the Kalman filter 54. Further, as shown in FIG. 11 and FIG. 14A, if the period is limited, it is possible to assume that the oscillation frequency changes at a constant aging rate within that period. For example, it is possible to assume that the oscillation frequency changes with a constant gradient as represented by the symbol C3 shown in FIG. 14A.

In the present embodiment, the correction value for compensating (canceling out) such a frequency variation at the constant aging rate due to the aging variation component is obtained using the following formula. D(k)=D(k−1)+E·ek In other words, the correction value D(k) for compensating the frequency variation at the aging rate corresponding to the gradient of the arrowed line C3 shown in FIG. 14A is obtained. Here, the aging rate is not constant, but varies with elapsed time as shown in FIG. 11 and FIG. 14A.

In this regard, in the present embodiment, the update process of the correction value D(k) corresponding to the aging rate is performed based on the measurement residual ek=y(k)−x^−(k) of the Kalman filtering as expressed by the following formula D(k)=D(k−1)+E·ek. Therefore, it becomes possible to realize the update process of the correction value D(k) reflecting also the variation in the aging rate with elapsed time. Therefore, it becomes possible to realize the highly accurate aging correction.

11. Temperature Sensor, Oscillation Circuit

Figure 18A:
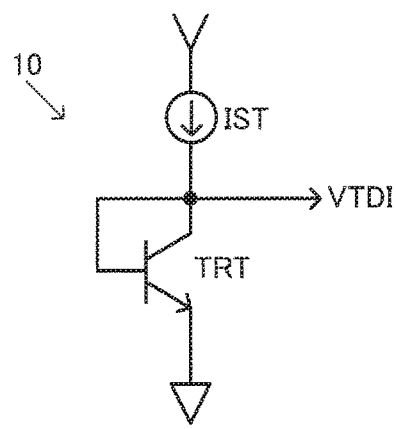
FIGS. 18A and 18B are diagrams showing a configuration example of a temperature sensor and an oscillation circuit.

FIG. 18A shows a configuration example of the internal temperature sensor 10. The temperature sensor 10 shown in FIG. 18A has a current source IST, and a bipolar transistor TRT having a collector supplied with a current from the current source IST. The bipolar transistor TRT has a diode connection in which the collector and the base are connected to each other, and the temperature detection voltage VTDI having a temperature characteristic is output to a node of the collector of the bipolar transistor TRT. The temperature characteristic of the temperature detection voltage VTDI is caused by the temperature dependency of the base-emitter voltage of the bipolar transistor TRT. The temperature detection voltage VTDI of the internal temperature sensor 10 has, for example, a negative temperature characteristic (a first-order temperature characteristic having a negative gradient).

Figure 18B:
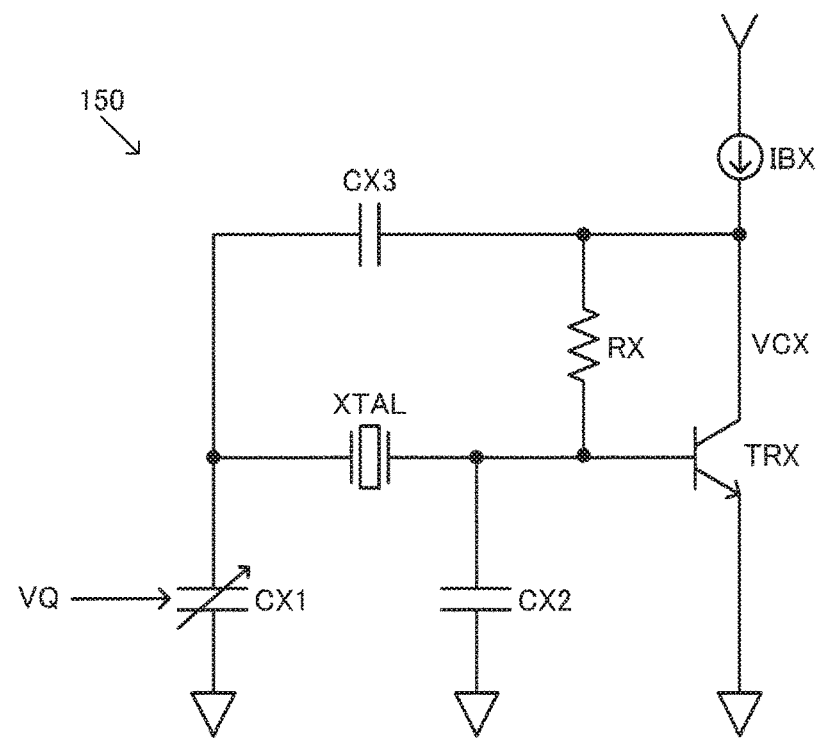

FIG. 18B shows a configuration example of the oscillation circuit 150. The oscillation circuit 150 has a current source IBX, a bipolar transistor TRX, a resistor RX, a variable-capacitance capacitor CX1, capacitors CX2, CX3.

The current source IBX supplies the collector of the bipolar transistor TRX with a bias current. The resistor RX is disposed between the collector and the base of the bipolar transistor TRX.

One end of the variable-capacitance capacitor CX1, the capacitance of which is variable, is connected to one end of the resonator XTAL. Specifically, the one end of the variable-capacitance capacitor CX1 is connected to the one end of the resonator XTAL via the first resonator terminal (the resonator pad) of the circuit device. One end of the capacitor CX2 is connected to the other end of the resonator XTAL. Specifically, the one end of the capacitor CX2 is connected to the other end of the resonator XTAL via the second resonator terminal (the resonator pad) of the circuit device. One end of the capacitor CX3 is connected to the one end of the resonator XTAL, and the other end of the capacitor CX3 is connected to the collector of the bipolar transistor TRX.

The base-emitter current caused by the oscillation of the resonator XTAL flows through the bipolar transistor TRX. Further, when the base-emitter current increases, the collector-emitter current of the bipolar transistor TRX increases, and the bias current branched from the current source IBX to the resistor RX decreases, and therefore, the collector voltage VCX is lowered. In contrast, when the base-emitter current of the bipolar transistor TRX decreases, the collector-emitter current decreases, and the bias current branched from the current source IBX to the resistor RX increases, and therefore, the collector voltage VCX is raised. The collector voltage VCX is fed back to the resonator XTAL via the capacitor CX3.

The oscillation frequency of the resonator XTAL has a temperature characteristic, and the temperature characteristic is compensated by the output voltage VQ (the frequency control voltage) of the D/A converter 80. Specifically, the output voltage VQ is input to the variable-capacitance capacitor CX1, and thus, the capacitance value of the variable-capacitance capacitor CX1 is controlled by the output voltage VQ. When the capacitance value of the variable-capacitance capacitor CX1 changes, the resonance frequency of the oscillation loop changes, and therefore, the variation of the oscillation frequency due to the temperature characteristic of the resonator XTAL is compensated. The variable-capacitance capacitor CX1 is realized by, for example, a variable-capacitance diode (varactor) or the like.

It should be noted that the oscillation circuit 150 according to the present embodiment is not limited to the configuration shown in FIG. 18B, but a variety of practical modifications can be adopted. For example, in FIG. 18B, the case of using the variable-capacitance capacitor as the capacitor CX1 is explained as an example. However, it is also possible to use the variable-capacitance capacitor controlled by the output voltage VQ as the capacitor CX2 or the capacitor CX3. Further, it is also possible to use the variable-capacitance capacitors controlled by the output voltage VQ as two or more of the capacitors CX1 through CX3.

Further, the oscillation circuit 150 is not required to include all of the circuit elements necessary to oscillate the resonator XTAL. For example, it is also possible to adopt a configuration in which some of the circuit elements are formed of discrete components disposed outside the circuit device 500, and are connected to the oscillation circuit 150 via the external connection terminals.

12. Modified Examples

Figure 19A:
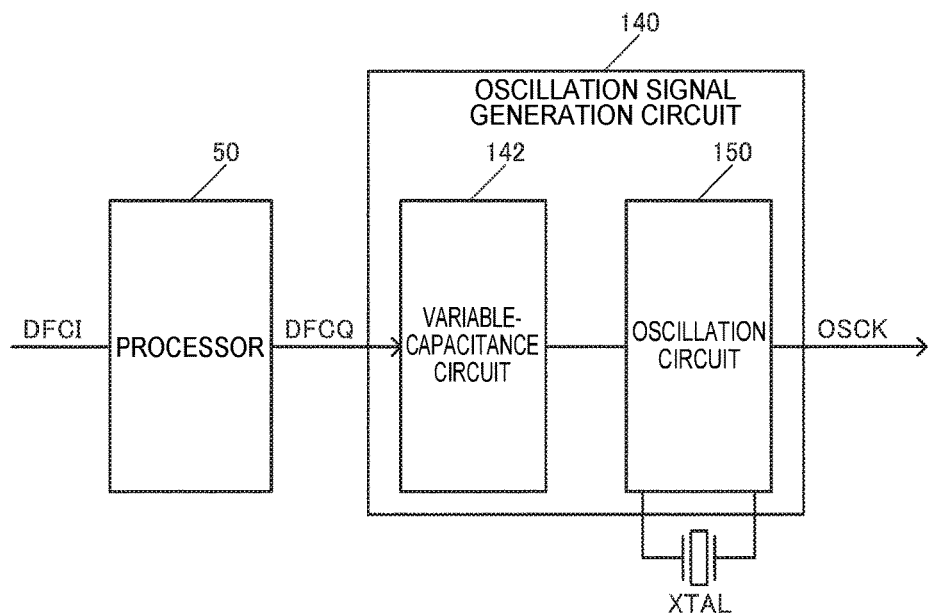
FIGS. 19A and 19B are explanatory diagrams of a modified example of the embodiment.

Then, a variety of modified examples of the present embodiment will be described. FIG. 19A shows a configuration example of a circuit device according to the modified example of the present embodiment.

In FIG. 19A, unlike FIG. 1, FIG. 4, and FIG. 13, the oscillation signal generation circuit 140 is not provided with the D/A converter 80. Further, the oscillation frequency of the oscillation signal OSCK generated by the oscillation signal generation circuit 140 is directly controlled based on the frequency control data DFCQ from the processor 50. In other words, the oscillation frequency of the oscillation signal OSCK is controlled without intervention of the D/A converter.

For example, in FIG. 19A, the oscillation signal generation circuit 140 has a variable-capacitance circuit 142 and the oscillation circuit 150. The oscillation signal generation circuit 140 is not provided with the D/A converter 80 shown in FIG. 1, FIG. 4 and FIG. 13. Further, the variable-capacitance circuit 142 is provided instead of the variable-capacitance capacitor CX1 shown in FIG. 18B, and one end of the variable-capacitance circuit 142 is connected to the one end of the resonator XTAL.

The capacitance value of the variable-capacitance circuit 142 is controlled based on the frequency control data DFCQ from the processor 50. For example, the variable-capacitance circuit 142 has a plurality of capacitors (a capacitor array), and a plurality of switch elements (a switch array) each controlled to be set to the ON state or the OFF state based on the frequency control data DFCQ. Each of the switch elements is electrically connected to corresponding one of the capacitors. Further, by setting the switch elements to the ON state or the OFF state, the number of capacitors, one ends of which are connected to the one end of the resonator XTAL out of the plurality of capacitors, varies. Thus, the capacitance value of the variable-capacitance circuit 142 is controlled, and thus, the capacitance value of the one end of the resonator XTAL changes. Therefore, the capacitance value of the variable-capacitance circuit 142 is directly controlled by the frequency control data DFCQ, and it becomes possible to control the oscillation frequency of the oscillation signal OSCK.

Figure 19B:
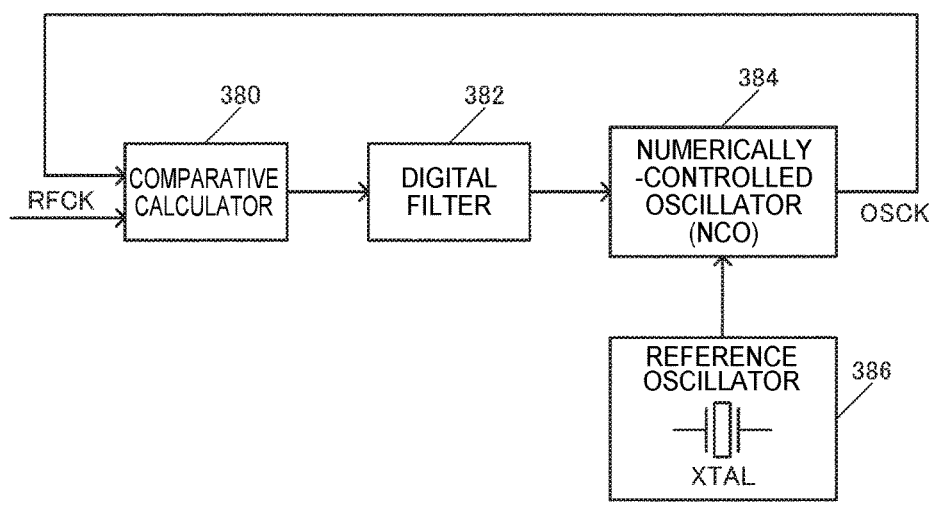

Further, in the case of constituting the PLL circuit using the circuit device according to the present embodiment, it is possible to adopt the PLL circuit having a direct digital synthesizer system. FIG. 19B shows the circuit configuration example of the case of the direct digital synthesizer system.

A comparative calculator 380 performs the comparative calculation between the reference signal RFCK and the oscillation signal OSCK (an input signal based on the oscillation signal). A digital filter 382 performs a smoothing process of the phase error. The configuration and the operation of the comparative calculator 380 are the same as those of the comparative calculator 41 shown in FIG. 13, and the counter and the TDC (time digital converter) can be included. The digital filter 382 corresponds to the digital filter 44 shown in FIG. 13. A numerically-controlled oscillator 384 is a circuit for digitally synthesizing an arbitrary frequency and waveform using a reference oscillation signal from a reference oscillator 386 having the resonator XTAL. Specifically, unlike the VCO which controls the oscillation frequency based on the control voltage from the D/A converter, the numerically-controlled oscillator 384 generates the oscillation signal OSCK with an arbitrary oscillation frequency by a digital calculation process using the digital frequency control data and the reference oscillator 386 (the resonator XTAL).

13. Oscillator, Electronic Apparatus, and Moving Object

Figure 20A:
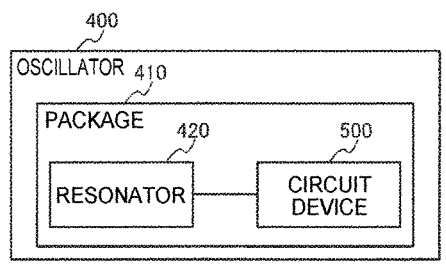
FIGS. 20A to 20C are diagrams showing configuration examples of an oscillator, an electronic apparatus, and a moving object.

FIG. 20A shows a configuration example of the oscillator 400 including the circuit device 500 according to the present embodiment. As shown in FIG. 20A, the oscillator 400 includes the resonator 420 and the circuit device 500. The resonator 420 and the circuit device 500 are mounted in a package 410 of the oscillator 400. Further, terminals of the resonator 420 and terminals (pads) of the circuit device 500 (IC) are electrically connected respectively to each other with interconnections of the package 410.

Figure 20B:
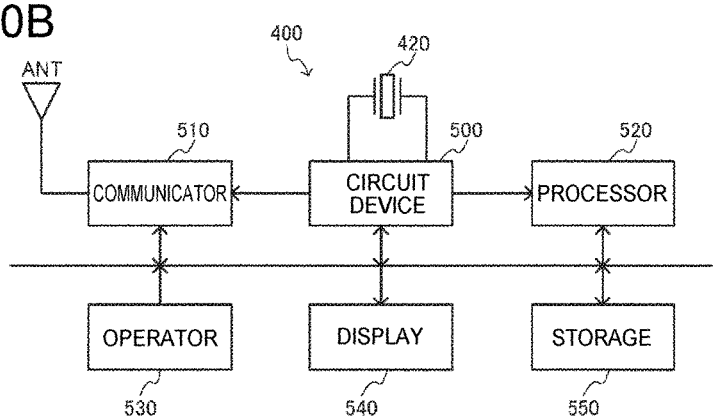

FIG. 20B shows a configuration example of an electronic apparatus including the circuit device 500 according to the present embodiment. The electronic apparatus includes the circuit device 500 according to the present embodiment, the resonator 420 such as a quartz crystal resonator, an antenna ANT, a communicator 510, and a processor 520. Further, the electronic apparatus can include an operator 530, a display 540, and a storage 550. The resonator 420 and the circuit device 500 constitute the oscillator 400. It should be noted that the electronic apparatus is not limited to the configuration shown in FIG. 20B, but a variety of practical modifications such as elimination of some of the constituents or addition of other constituents can be adopted.

As the electronic apparatus shown in FIG. 20B, there can be assumed a variety of apparatuses such as a network-related apparatus such as a base station, or a router, a highly accurate measurement instrument, a wearable apparatus such as a timepiece incorporating GPS, a biological information measurement apparatus (e.g., a sphygmograph or a pedometer), or a head-mounted display device, a portable information terminal (a mobile terminal) such as a smartphone, a cellular phone, a portable video game player, a laptop PC, or a tablet PC, a content supply terminal for delivering contents, a video apparatus such as a digital camera or a video camera.

The communicator 510 (a wireless circuit) performs a process of receiving data externally via the antenna ANT and transmitting data to the outside. The processor 520 performs a control process of the electronic apparatus, a variety of types of digital processing of the data transmitted or received via the communicator 510. The function of the processor 520 can be realized by a processor such as a microcomputer.

The operator 530 is for allowing the user to perform an input operation, and can be realized by operation buttons, a touch panel display, and so on. The display 540 is for displaying a variety of types of information, and can be realized by a display using a liquid crystal, an organic EL, and so on. It should be noted that in the case of using the touch panel display as the operator 530, it results that the touch panel display also functions as the operator 530 and the display 540. The storage 550 is for storing the data, and the function thereof can be realized by a semiconductor memory such as a RAM or a ROM, a hard disk drive (HDD), or the like.

Figure 20C:
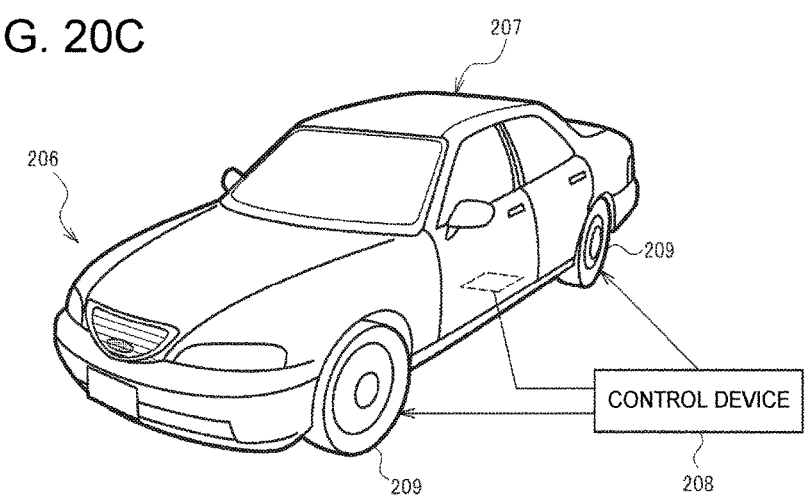

FIG. 20C shows an example of a moving object including the circuit device according to the present embodiment. The circuit device (the oscillator) according to the present embodiment can be incorporated in a variety of moving objects such as a vehicle, an airplane, a motorbike, a bicycle, a ship, or a boat. The moving object is equipment or a device, which is provided with a drive mechanism such as an engine or an electric motor, a steering mechanism such as a steering wheel or a helm, and a variety of electronic apparatuses (in-car apparatuses), and moves on the ground, in the air, or on the sea. FIG. 20C schematically shows a vehicle 206 as a specific example of the moving object. The vehicle 206 incorporates an oscillator (not shown) having the circuit device according to the present embodiment and a resonator. A control device 208 operates with the clock signal generated by the oscillator. The control device 208 controls the stiffness of the suspension, and controls the brake of each of the wheels 209 in accordance with, for example, the attitude of a vehicle body 207. For example, it is also possible to realize automated driving of the vehicle 206 using the control device 208. It should be noted that the apparatus incorporating the circuit device or the oscillator according to the present embodiment is not limited to such a control device 208, but the circuit device or the oscillator according to the present embodiment can be incorporated in a variety of apparatuses provided to a moving object such as the vehicle 206.

Figure 21:
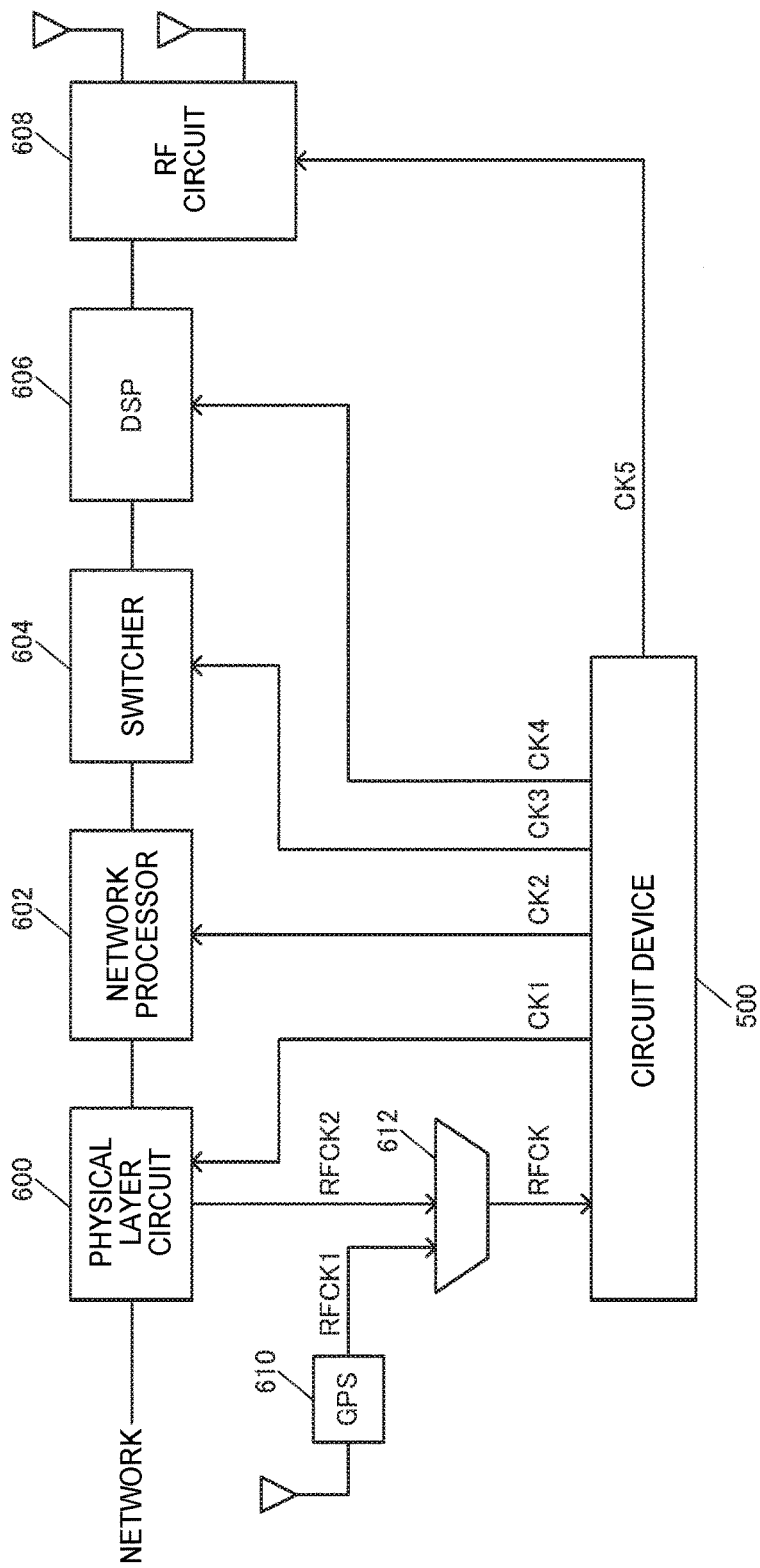
FIG. 21 is a diagram showing a configuration example of a base station as one of electronic apparatuses.

FIG. 21 is a diagram showing a configuration example of a base station (a base station device) as one of electronic apparatuses. A physical layer circuit 600 performs a process of the physical layer in the communication process via a network. A network processor 602 performs a process of a higher layer (e.g., a link layer) of the physical layer. A switcher 604 performs a variety of switching processes of the communication process. A DSP 608 performs a variety of types of digital signal processing necessary for the communication process. An RF circuit 608 includes a receiver circuit formed of a low-noise amplifier (LNA), a transmitter circuit formed of a power amplifier, a D/A converter, an A/D converter, and so on.

A selector 612 outputs either one of a reference signal RFCK1 from the GPS 610 and a reference signal RFCK2 (a clock signal from the network) from the physical layer circuit 600 to the circuit device 500 according to the present embodiment as the reference signal RFCK. The circuit device 500 performs a process of synchronizing the oscillation signal (an input signal based on the oscillation signal) with the reference signal RFCK. Then, the circuit device 500 generates a variety of clock signals CK1, CK2, CK3, CK4, andCK5 different in frequency, and supplies the physical layer circuit 600, the network processor 602, the switcher 604, the DSP 606, and the RF circuit 608 with the respective clock signals CK1, CK2, CK3, CK4, and CK5.

According to the circuit device 500 related to the present embodiment, in the base station shown in FIG. 21, it becomes possible to synchronize the oscillation signal with the reference signal RFCK, and supply each of the circuits of the base station with the clock signals CK1 through CK5 high in frequency stability generated based on the oscillation signal.

It should be noted that although the one or more embodiments hereinabove are explained in detail, it should easily be understood by those skilled in the art that it is possible to make a variety of modifications not substantially departing from the novel matters and the advantage of the one or more embodiments of the invention. Therefore, all of such modified examples should be included in the scope of the various embodiments of the invention. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the various embodiments of the invention. Further, the configurations and the operations of the external temperature sensor, the programmable gain amplifier, the digital filter, the processor, the oven control circuit, the circuit device, the oscillator, the electronic apparatus, and the moving object are not limited to those described in the present embodiment, but can be implemented with a variety of modifications.

What is claimed is:

1. A circuit device comprising:
   a processor adapted to perform a signal processing of temperature compensation of an oscillation frequency based on temperature detection data from an external temperature sensor disposed outside the circuit device to output frequency control data;
   an oscillation signal generation circuit adapted to generate an oscillation signal with the oscillation frequency corresponding to the frequency control data using the frequency control data and a resonator disposed in a thermostatic oven;
   an A/D converter adapted to perform A/D conversion on a temperature detection voltage from the external temperature sensor to output the temperature detection data; and
   an input terminal adapted to input the temperature detection voltage from the external temperature sensor to the A/D converter.

2. The circuit device according to claim 1 further comprising:
   a programmable gain amplifier connected to the input terminal,
   wherein the temperature detection voltage is input from the input terminal to the A/D converter via the programmable gain amplifier.

3. The circuit device according to claim 1 further comprising:
   a digital filter connected to the A/D converter,
   wherein the temperature detection data output from the A/D converter is input to the processor via the digital filter.

4. The circuit device according to claim 1 further comprising:
   an internal temperature sensor,
   wherein the A/D converter performs A/D conversion on an internal temperature detection voltage from the internal temperature sensor in a first mode, and performs A/D conversion on the temperature detection voltage from the external temperature sensor in a second mode.

5. The circuit device according to claim 1, wherein
   the processor extracts an aging variation component from variation components of the frequency control data including the aging variation component and a temperature variation component based on the temperature detection data, and then performs an aging correction process of the frequency control data based on the aging variation component extracted.

6. The circuit device according to claim 1 further comprising:
   an oven control circuit adapted to control a heater disposed in the thermostatic oven.

7. An electronic apparatus comprising:
   the circuit device according to claim 1.

8. A moving object comprising:
   circuit device according to claim 1.

9. An oscillator comprising:
   an external temperature sensor disposed outside a circuit device;
   a thermostatic oven;
   a resonator disposed in the thermostatic oven;
   a heater disposed in the thermostatic oven; and
   a circuit device including
   a processor adapted to perform a signal processing of temperature compensation of an oscillation frequency based on temperature detection data from the external temperature sensor to output frequency control data,
   an oscillation signal generation circuit adapted to generate an oscillation signal with the oscillation frequency corresponding to the frequency control data using the frequency control data and the resonator,
   an A/D converter adapted to perform A/D conversion on a temperature detection voltage from the external temperature sensor to output the temperature detection data, and
   an input terminal adapted to input the temperature detection voltage from the external temperature sensor to the A/D converter.

10. The oscillator according to claim 9, wherein
    defining a distance between the resonator and the circuit device as L1, and a distance between the resonator and the external temperature sensor as L2, L2>L1 is true.

* * * * *